United States Patent
Own et al.

(10) Patent No.: US 9,997,331 B1
(45) Date of Patent: Jun. 12, 2018

(54) CHARGED-PARTICLE BEAM MICROSCOPY

(71) Applicant: Mochii, Inc., Seattle, WA (US)

(72) Inventors: Christopher Su-Yan Own, Seattle, WA (US); Matthew Francis Murfitt, Seattle, WA (US)

(73) Assignee: Mochii, Inc., Seattle, WA (US)

( * ) Notice: Subject to any disclaimer, the term of this patent is extended or adjusted under 35 U.S.C. 154(b) by 0 days. days.

(21) Appl. No.: 14/607,079

(22) Filed: Jan. 28, 2015

Related U.S. Application Data

(60) Provisional application No. 61/932,159, filed on Jan. 27, 2014, provisional application No. 62/013,514, filed on Jun. 17, 2014.

(51) Int. Cl.
*H01J 37/28* (2006.01)
*H01J 37/18* (2006.01)
*H01J 37/16* (2006.01)

(52) U.S. Cl.
CPC ............ *H01J 37/28* (2013.01); *H01J 37/16* (2013.01); *H01J 37/18* (2013.01); *H01J 2237/18* (2013.01); *H01J 2237/2802* (2013.01); *H01J 2237/2812* (2013.01)

(58) Field of Classification Search
None
See application file for complete search history.

(56) References Cited

U.S. PATENT DOCUMENTS

| | | | |
|---|---|---|---|
| 3,736,422 A * | 5/1973 | Weber | H01J 37/28 250/311 |
| 6,570,157 B1 * | 5/2003 | Singh | G03F 7/70516 250/252.1 |
| 6,992,300 B2 | 1/2006 | Moses et al. | |
| 8,334,510 B2 * | 12/2012 | Shachal | G01N 23/22 250/306 |
| 8,492,716 B2 | 7/2013 | Shachal et al. | |
| 2009/0224650 A1 * | 9/2009 | Kim | H01J 37/18 313/420 |
| 2011/0210247 A1 * | 9/2011 | Shachal | H01J 37/16 250/307 |
| 2012/0025074 A1 * | 2/2012 | Barbi | G01T 1/2018 250/307 |
| 2014/0284477 A1 * | 9/2014 | Ebine | H01J 37/244 250/310 |
| 2014/0299769 A1 * | 10/2014 | Okai | H01J 37/28 250/310 |

FOREIGN PATENT DOCUMENTS

JP     05054844 A *  3/1993  ............ C23C 14/24

* cited by examiner

*Primary Examiner* — Michael Logie
(74) *Attorney, Agent, or Firm* — Nienstadt PLLC

(57) ABSTRACT

A charged-particle beam microscope includes a charged-particle beam source to generate a charged-particle beam. A stage is provided to hold a sample in the path of the charged-particle beam. Beam optics are provided to illuminate the sample with the charged-particle beam. One or more detectors are provided to detect radiation emanating from the sample as a result of the illumination. A controller may control one or more of the beam optics, stage, and detectors to generate an image of the sample based on the detected radiation.

18 Claims, 21 Drawing Sheets

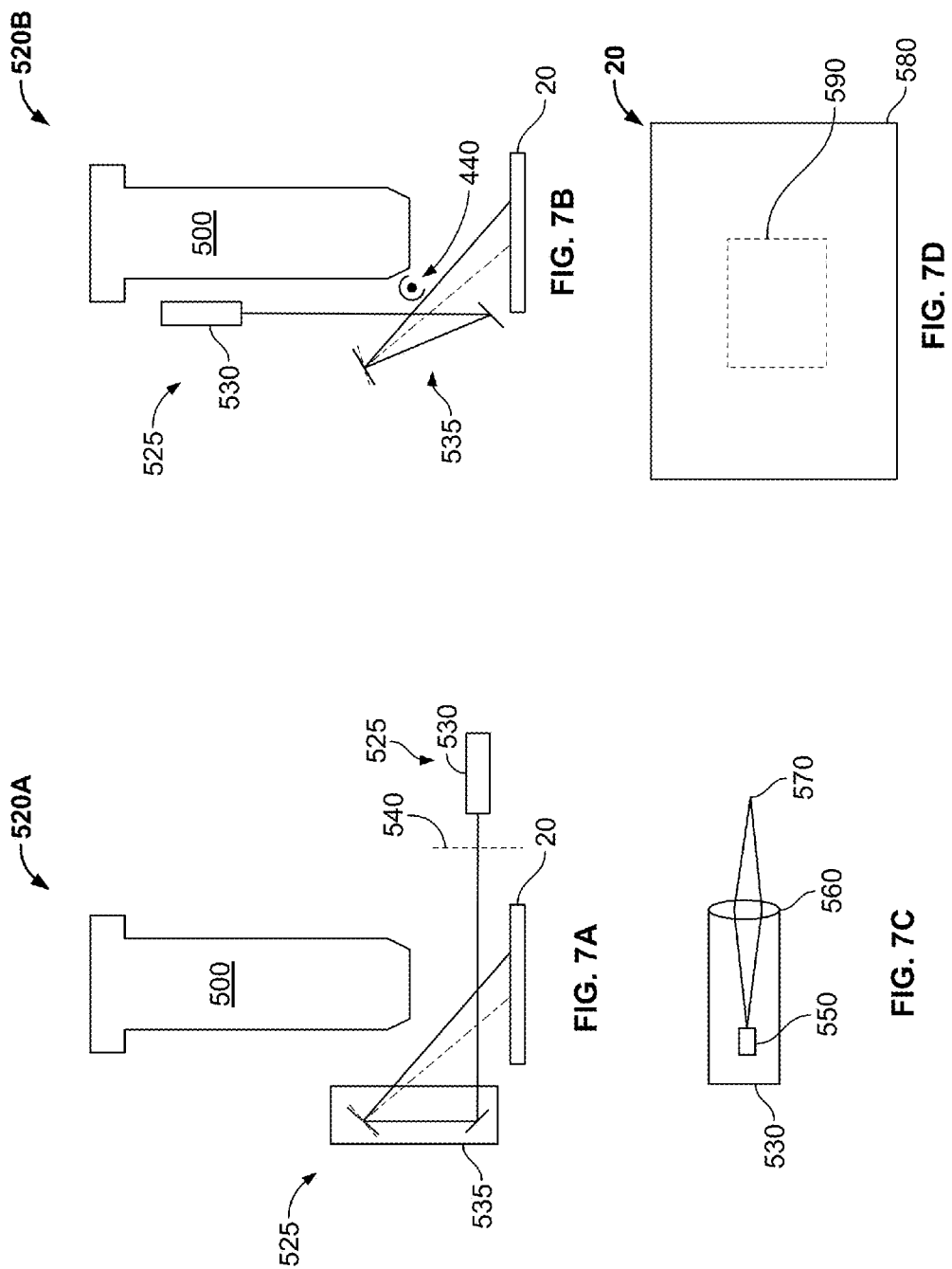

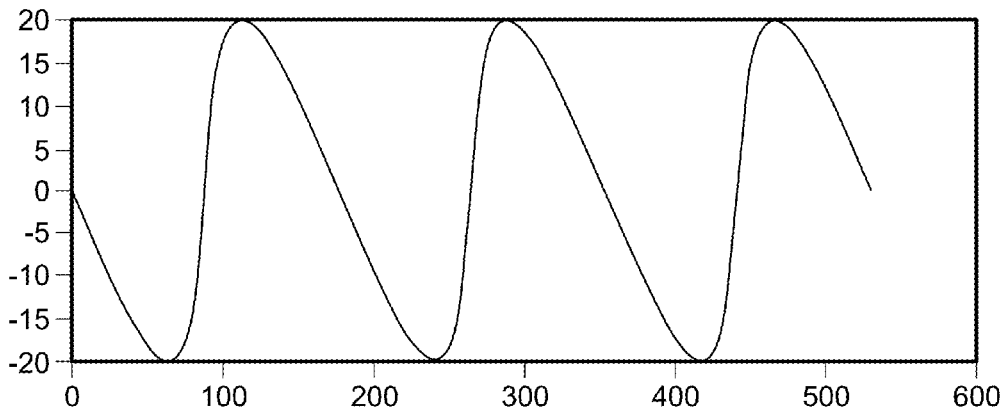
FIG. 17C
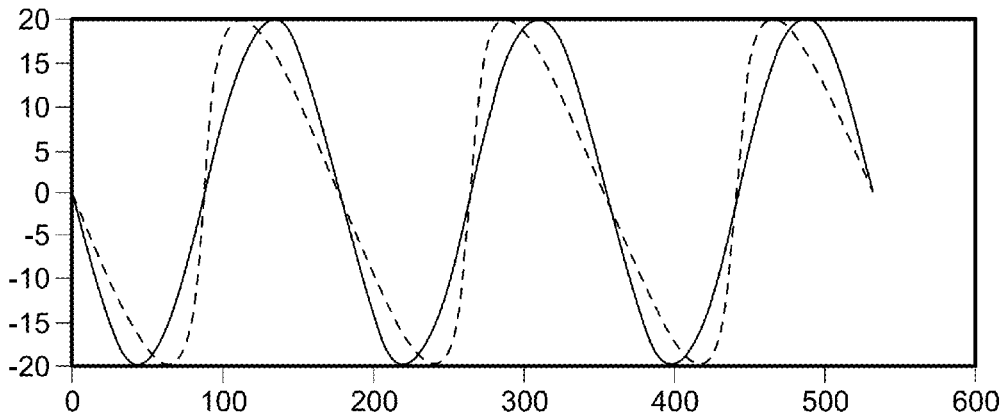
FIG. 17D
FIG. 17E

Unprocessed:

Simple Processed:

Advanced Processed:

Instability:

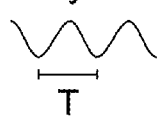
T
Known Systematic Frequency With
Characteristic Period T=1/f Causes
Interference in the Images

FIG. 19A

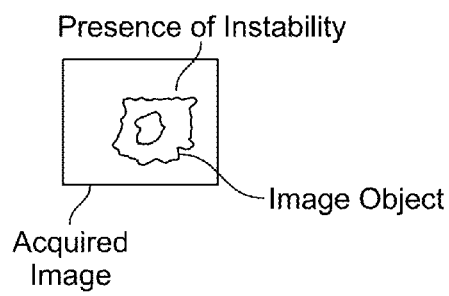

Presence of Instability
Image Object
Acquired Image

FIG. 19B

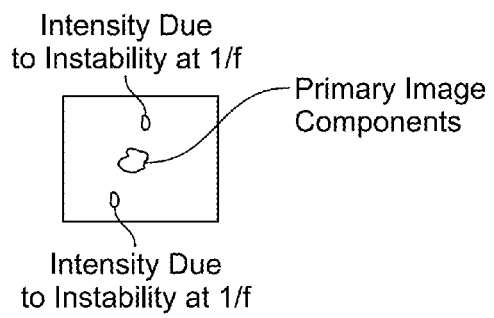

Intensity Due to Instability at 1/f
Primary Image Components
Intensity Due to Instability at 1/f

FIG. 19C

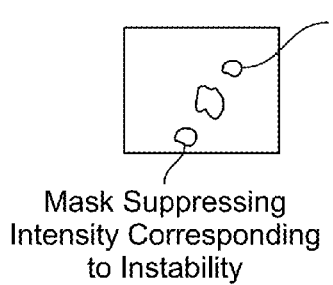

Mask Suppressing Intensity Corresponding to Instability
Mask Suppressing Intensity Corresponding to Instability

FIG. 19D

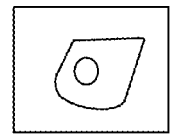

FIG. 19E

CHARGED-PARTICLE BEAM MICROSCOPY

CLAIM FOR PRIORITY

This application claims priority under 35 U.S.C. § 119(e) to Provisional Application No. 61/932,159, filed Jan. 27, 2014, and Provisional Application 62/013,514, filed Jun. 17, 2014, all of which are incorporated herein by reference in their entireties.

TECHNICAL FIELD

This application relates to improvements in charged-particle beam microscopy.

BACKGROUND

Charged-particle beam microscopy, which includes electron microscopy and focused ion beam microscopy, can be used to image samples at very small dimensions. For example, charged-particle beam microscopy can be used to investigate samples at dimensions smaller than what is possible using only light microscopy. Charged-particle beam microscopy may also reveal information that is not readily available through light microscopy, such as in relation to composition, crystallography, and topography of the sample.

However, conventional charged-particle microscopes typically suffer from a number of disadvantages compared to light microscopes. Conventional charged-particle microscopes are usually cumbersome to maintain and repair. For example, replacing worn or damaged internal components of a microscope may require specialized knowledge and extreme care so as not to contaminate the normally evacuated space within the microscope or damage the sensitive componentry.

Moreover, conventional charged-particle microscopes are typically complicated to operate, requiring extensive training. In addition, charged-particle microscopes are typically expensive and require the human operator who wants to image a sample to be present at a single user terminal that is locally connected to the microscope. Popular access to the benefits of charged-particle microscopy has therefore been severely limited.

Thus, it is desirable to provide charged-particle beam microscopy that permits relatively easy and reliable replacement of components. It is also desirable for a charged-particle beam microscope to be relatively easy to use and accessible.

SUMMARY

In one embodiment, a charged-particle beam microscope is provided for imaging a sample. The microscope comprises a stage to hold a sample. A sealed charged-particle-beam module is provided that defines a substantially airtight volume. The sealed module comprises a charged-particle beam source to generate a charged-particle beam inside the volume. The sealed module also comprises beam optics within the volume to converge the charged-particle beam onto the sample. A detector is provided to detect radiation emanating from the sample to generate an image. A controller analyzes the detected radiation to generate an image of the sample.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate several embodiments and aspects of the transmission electron microscopes described herein and, together with the description, serve to explain the principles of the invention.

FIGS. 7A and 7B are schematic side views of different exemplary embodiments of a charged-particle beam microscope having an internal scanning light microscope (SLM).

FIG. 7C is a schematic side view of an example of an embodiment of the scanning light module shown in FIGS. 7A and 7B.

FIG. 7D is a diagram of an example of an embodiment of two fields of view for a charged-particle beam microscope and a scanning light microscope, respectively.

FIGS. 17A, 17B, 17C, 17D, and 17E are plots and images illustrating an example of another embodiment of a method for correcting distortions.

FIG. 19A is a plot of an example of an embodiment of a periodic distortion signal.

FIGS. 19B, 19C, 19D, and 19E are schematic diagrams of sequential steps of removing the distortion caused by the periodic distortion signal of FIG. 19A in an image.

DETAILED DESCRIPTION

A charged-particle microscope (hereinafter referred to simply as a "microscope"), such as an electron microscope (EM) or focused ion beam (FIB) microscope, may be adapted and used advantageously to image and examine samples. An EM may comprise, for example, a scanning electron microscope (SEM), scanning transmission electron microscope (STEM), or transmission electron microscope (TEM). The microscope may illuminate the sample with one or more charged-particle beams and detect radiation from the sample to generate an image of the sample. A SEM or STEM, for example, scans an electron beam that is formed into a probe across the sample. The images may be evaluated, such as by a human user of the microscope, to identify characteristics of the sample.

Figure 1:
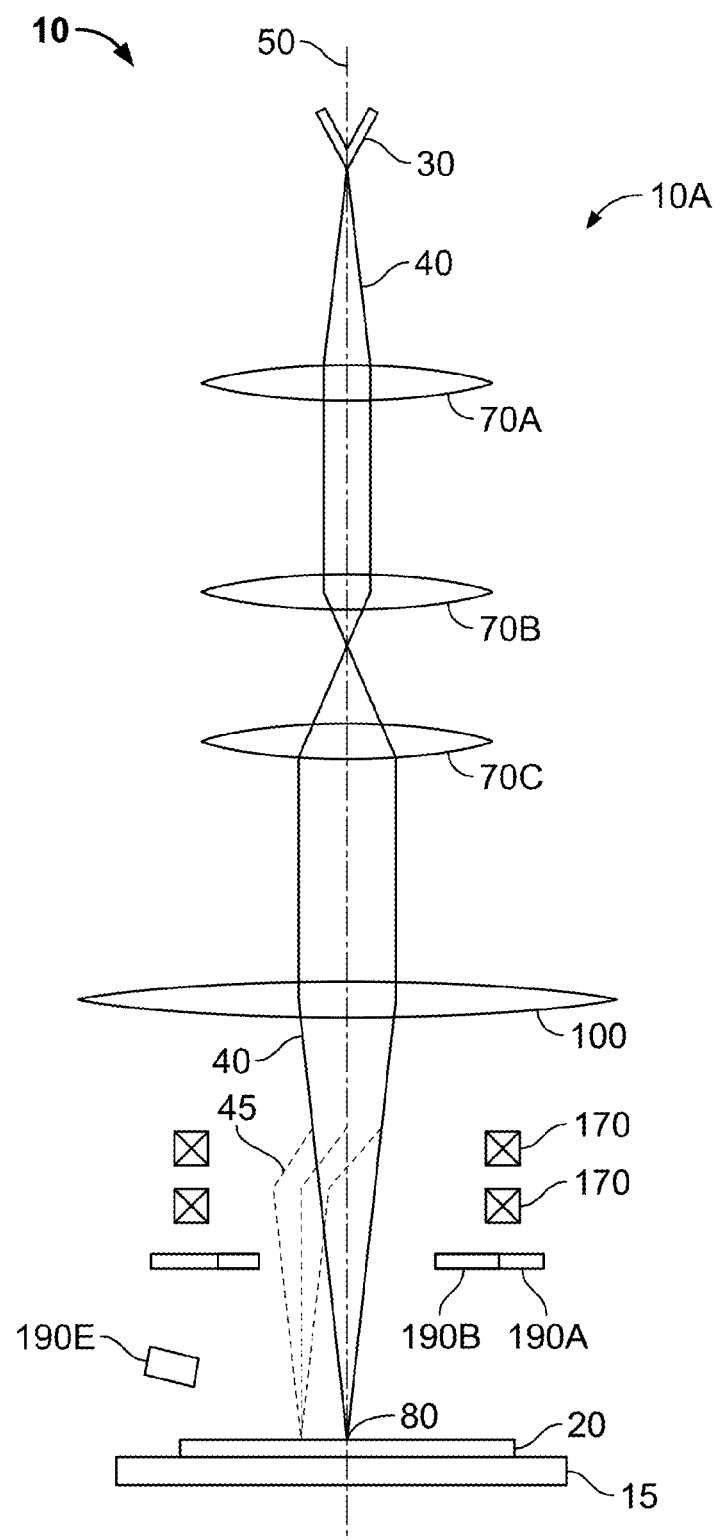
FIG. 1 is a schematic diagram of an example of an embodiment of a scanning electron microscope (SEM).

FIG. 1 is a schematic diagram of an example of an embodiment of a microscope 10 that is a SEM 10A, provided for the sake of illustration. SEM 10A has a housing that, when closed, is substantially airtight and defines a chamber with an enclosed volume therein. A sample 20 can be placed inside SEM 10A, such that an area that can be exposed to an electron beam probe 80 for imaging. Sample 20 may include and be supported, for example, by a substrate (not shown). Sample 20 may be of any quantity, may be of any suitable shape or size, and may include any desired features. For example, sample 20 may include a specific configuration for a desired application or parameter setting. In another embodiment, discussed in further detail below, sample 20 is a reference (or "test") sample used for testing or optimization purposes, such as containing gold nanoparticles. The substrate that can be used to support sample 20 may include a layer of crystalline or amorphous carbon. Single-atomic-layer graphene may also be used. Alternatively or in addition, the substrate may include boron nitride, silicon, silicon dioxide, aluminum, polymeric resins, or organic materials.

SEM 10A may have a stage 15 to support and move sample 20 within SEM 10A. In one version, stage 15 is adapted to be moved continuously while the charged-particle beam is simultaneously scanned. This may improve throughput by allowing continuous acquisition of images while eliminating the settling time caused by stop-start motion of a stage that is moved discretely and that may prevent acquisition of a still image of the sample.

For example, stage 15 may be a piezoelectric stage. The piezoelectric stage may have a piezoelectric motor that is capable of moving the stage very quickly and smoothly so that short exposures on the order of milliseconds or microseconds can be practically achieved. The piezoelectric stage may also be adapted to move the stage with very high positional precision. In one embodiment, the stage motor is capable of displacing the sample at a speed of at least about 100 nm per second.

SEM 10A includes an electron beam source 30 to generate an electron beam 40. Electron beam source 30 may be adapted to generate an electron beam having a current of less than about 100 mA. For example, for many applications electron beam source 30 may generate a beam current of from about 10 picoamps to about 1 milliamp. In an especially low-current version, however, electron beam source 30 may be adapted to generate electron beam 40 to have a current of less than about 10 µA, such as less than about 10 pA.

SEM 10A has an optical system through which electron beam 40 travels from source 30 to sample 20, and optionally through which electron beam 40 travels after it has been transmitted through sample 20. The optical system may define an optic axis 50 along which electron beam 40 travels. The optical system may include illumination optics. The illumination optics may include condenser lenses 70A-C to form electron beam 40 into a collimated probe 80 that illuminates sample 20. Condenser lenses 70A-C may consist of, for example, two, three (as shown in the figure), or four lenses. Condenser lenses 70A-C may be magnetic or electrostatic.

The optical system of SEM 10A may also include an objective lens 100 to focus electron beam 40. An objective aperture 110 may be provided in the back focal plane of objective lens 100 or a plane conjugate to the back focal plane to define an acceptance angle, referring to an angle of electron beam 40 that is transmitted through aperture 110 and allowed to illuminate specimen 20. The rays that objective lens 100 focuses to probe 80 on specimen 20 are thus limited in angle by aperture 110.

One or more beam scanners 170 may be provided to scan electron beam 40 across sample 20. FIG. 1 shows an example of a scanned beam 45 at a second position. Beam scanners 170 may scan electron beam 40 by generating either a magnetic or an electric field. For example, beam scanners 170 may include scan coils that generate an alternating magnetic field. Alternatively, beam scanners 170 may use electrostatic deflectors to scan electron beam 40. Beam scanners 170 may be provided in pairs, such as two or four paired scan coils or electrostatic deflectors. Beam scanners 170 can be excited with ramp waveforms, causing the collimated probe to be scanned across the sample and thereby producing an intensity signal at the detector unique to the location of the probe on the sample. FIG. 1 shows an example of electron beam 40 being scanned between a first position 180A and a second position 180B.

When sample 20 is illuminated, electrons interact with sample 20, producing radiation that emerges from the sample surface in a pattern that is collected by one or more detectors 190A-C. Detectors 190A-C may detect, and generate a signal based on the detection of, radiation that can include one or more of backscattered electrons, secondary electrons, auger electrons, cathodoluminescence, ionized gas, and x-rays.

The electron beam energy used in SEM 10A may be determined at least in part based on the target resolution, the transmission properties of sample 20, and the energy of the detected radiation. The penetration depth of the beam into sample 20 may be selected to permit the escape and detection of interaction radiation from sample 20. The penetration depth may be selected to be, for example, from about 1 nanometer to several micrometers, such as, for example, a penetration depth on the order of 2 nanometers, to result in a range of sensitivities to surface or subsurface structure.

If the electron beam is reflected back toward the illumination source, it is considered backscattered. In one example, backscatter electrons may only be successfully detected if they have an energy of at least about 2 keV. As a result, 2-3 keV electrons may be the lowest beam energy appropriate when considering detection of backscatter electrons. On the other hand, secondary electrons, which are produced by secondary processes at sample 20, may possess very low energies of, for example, from a few Volts to a few hundred Volts. Thus, the detection of secondary electrons may be compatible with lower beam energies.

Detectors 190A-B may detect electrons, such as backscatter electron beams, emerging from sample 20 at one or more angles. In one embodiment, atoms of sample 20 having higher atomic number scatter electrons to higher angles, while lighter atoms scatter electrons to lower angles, revealing information about the composition of sample 20. Detectors 190A-B may comprise, for example, a scintillator and a charge coupled device (CCD). The scintillator may include one or more concentric annular detector rings and a central circular disc detector in an approximately cylindrically symmetric detector arrangement to receive the electrons (as shown in FIG. 1). There may be apertures between detectors 190A-C. For each range of angles, detectors 190A-B may provide an intensity signal corresponding to current received for that angular range. If the detector is a CCD, the scattered beams may form an image of a diffraction pattern or channeling pattern of sample 20.

Alternatively to concentric, on-axis detectors, the detectors may have a shape that is cylindrically asymmetric. For example, the detectors may be segmented or configured as area detectors that are arranged off-axis. In other embodiments, the detectors have an inner or outer perimeter that is polygonal, such as square or hexagonal, or another suitable shape.

SEM 10A may be adapted to operate in a "low-angle" backscatter mode in which a detector, such as detector 190B, detects a "low-angle-scattered" of electrons emerging from specimen 20. The low-angle mode may be particularly sensitive to light elements in the sample, differentiating from heavier elements and indicating chemical composition.

Alternatively to the low-angle backscatter mode, SEM 10A may be adapted to operate in a high-angle backscatter mode in which one or more electron beams emerging from specimen 20 within a particular angular range are detected. Since sample 20 is illuminated at approximately a point, this angular range of detection can be tightly controlled. For example, the high-angle backscatter mode may be a high-angle mode in which an electron beam shaped as a hollow cone of preselected thickness is detected. The high-angle backscatter mode may involve detecting a hollow cone at higher angles, which is referred to as high-angle backscatter mode. The dark-field mode may also be a medium-angle backscatter mode, in which a range of angles between the low-angle mode and high-angle mode are detected. These dark-field modes can produce an image with monotonic contrast change with increasing atomic number, which enables direct interpretability of the image to determine relative atomic weights. For example, high-angle backscatter imaging can be used to obtain chemically sensitive images of clusters of molecules, atoms, or nanostructures. An electron beam source having a high-brightness gun may allow this mode to operate faster.

Additional signals, such as secondary electrons and x-rays produced by the interaction between electron probe 80 and sample 20, may also be simultaneously detected in the region near the sample by one or more detectors, such as a detector 190E.

Figure 2:
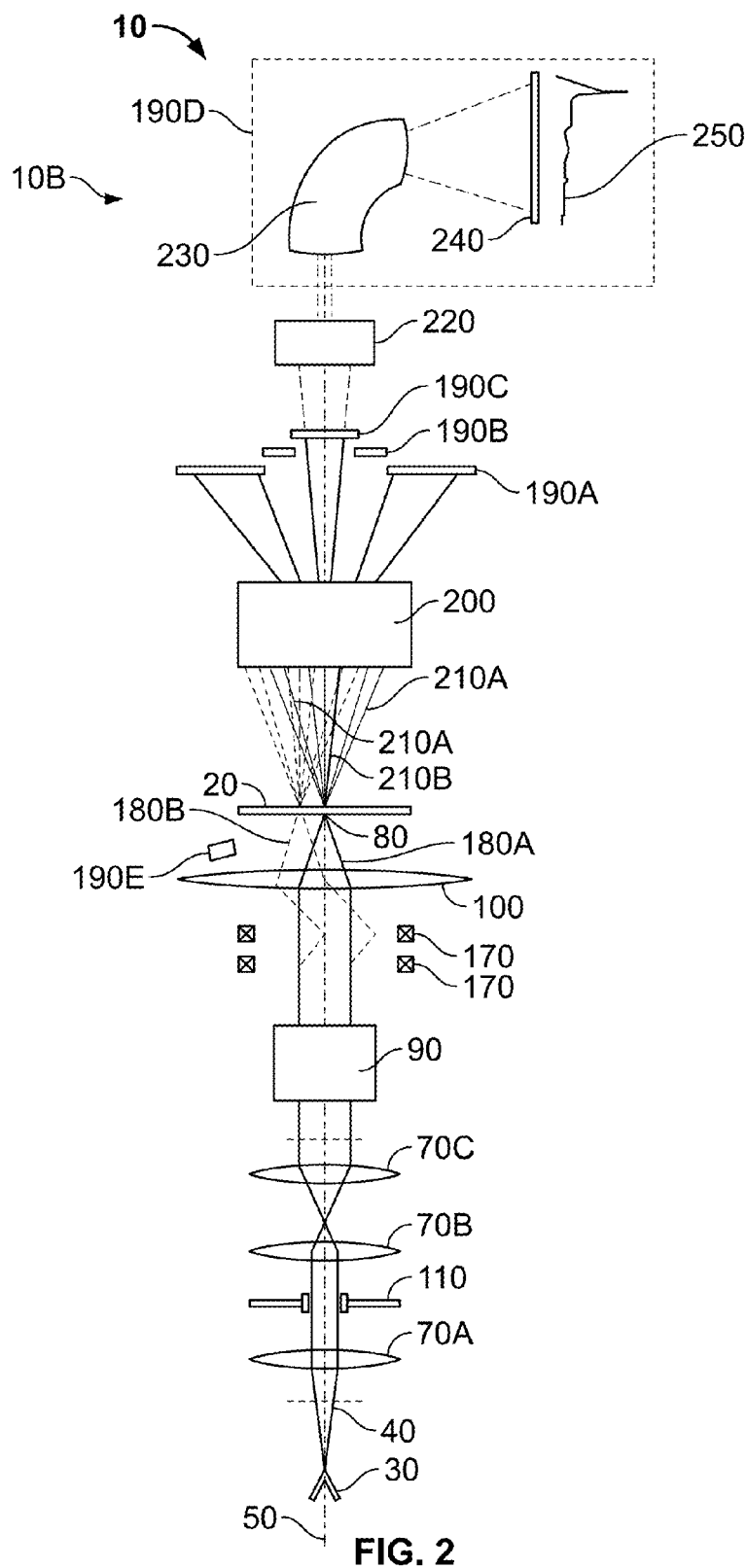
FIG. 2 is a schematic diagram of an example of an embodiment of a scanning transmission electron microscope (STEM).

FIG. 2 is a schematic diagram of another exemplary embodiment of a microscope 10, which in this case is a STEM 10B, provided for the sake of illustration. In the STEM mode, the scattered beam is transmitted through sample 20 and is therefore considered forward scattered. STEM 10B, like SEM 10A, may have a stage (not shown), electron beam source 30, illumination optics 60, objective lens 100, beam scanners 170, and detectors 190A-C, 190E.

In order to improve speed, accuracy, and sensitivity, STEM 10B may have a dedicated aberration corrector 90 to correct for aberrations in electron beam 40, such as spherical aberrations and parasitic aberrations. The parasitic aberrations may or may not be cylindrically symmetric. Aberration corrector 90 may include electromagnetic lenses to correct for these aberrations. Parasitic aberrations may be caused, for example, by the optical elements having been machined in such a way as to be very slightly off-axis or very slightly non-round. Examples of commercially available aberration correctors include Nion Co. quadrupole-octupole correctors (available from Nion Company of Kirkland, Wash.) and CEOS sextupole or quadrupole-octupole correctors (available from Corrected Electron Optical Systems GmbH of Heidelberg, Germany).

The optical system of STEM 10B may also include descanning and projection optics 200. The descanning optics may de-scan scattered electron beams 210A, 210B, thus, for example, realigning beam 210B with optic axis 50. The descanning optics may comprise, for example, descanning coils that may be symmetric to scan coils of beam scanners 170. The projection optics may include magnifying lenses that allow additional manipulation of scattered electron beams 210A, 210B.

The electron beam energy used in STEM 10B may be determined at least in part based on the transmission properties of sample 20. The substrate supporting sample 20 may have a thickness on the order of 2 nanometers, such as for example a thickness of about 1 nanometer. In one example, the substrate is made of carbon, although single-atomic-layer graphene may also be used. As a result, 1 keV electrons may be the lowest energy appropriate when considering voltage alone.

STEM 10B may be adapted to operate in a "bright field" mode in which a detector, such as detector 190C, detects a "forward-scattered" or "central" beam 210B of electrons emerging from specimen 20. Forward-scattered beam 210B refers to the zero beam (i.e., the 0 scattering vector, referring to the beam whose direction is identical to the orientation of beam 40 impinging on specimen 20) and a small range of angles around the zero beam. The bright-field mode may be particularly sensitive to the energy loss of the electrons, indicating chemical composition. These electrons can be detected to determine, for example, bonding energies of molecules that compose the sample.

Alternatively to the bright-field mode, STEM 10B may be adapted to operate in a dark-field mode in which one or more electron beams 210A emerging from specimen 20 within a particular angular range are detected. Since sample 20 is illuminated at approximately a point, this angular range of detection can be tightly controlled. For example, the dark-field mode may be an annular-dark-field (ADF) mode in which an electron beam shaped as a hollow cone of preselected thickness is detected. The dark-field mode may involve detecting a hollow cone at higher angles, which is referred to as high-angle annular-dark-field (HAADF) mode. The dark-field mode may also be a medium-angle dark-field (MADF) mode, in which a range of angles between the bright-field mode and the HAADF mode are detected. These dark-field modes can produce an image with monotonic contrast change with increasing atomic number, which enables direct interpretability of the image to determine relative atomic weights. For example, dark-field imaging can be used to obtain chemically sensitive projections of single atoms, clusters of atoms, or nanostructures. STEM 10B can also operate in simultaneous bright-field and dark-field modes. An electron beam source having a high-brightness gun may allow this mode to operate faster.

In one version, STEM 10B may have a detector 190D adapted to detect electrons in one or more preselected range of energies. Coupling optics 220 may be provided and detector 190D may include an electron prism 230 to filter out electrons that are not in the preselected energy ranges. In one version, this is used for electron energy loss spectroscopy (EELS). Electron prism 230 may, for example, generate an electric or magnetic field by using electrostatic or magnetic means, respectively. The field strength and dimensions of electron prism 230 may be selected such that, when the electrons of varying energies pass through the field, the electrons in the preselected energy range are transmitted through electron prism 230 while the remaining electrons are blocked. Detector 190D may also include a receiver 240, such as including a scintillator and CCD, to receive the transmitted electrons and convert that current into a detection signal. The EELS detection signal can be expressed as a plot 250 of current as a function of electron energy loss.

Furthermore, optics having a larger acceptance angle may improve resolution of STEM 10B. Because of this relationship between the acceptance angle and resolution of STEM 10B, the acceptance angle can be selected based on the desired resolution. For example, in a high-resolution STEM, if 1 Ångström resolution at 100 kilovolts is desired, it may be desirable to have at least about 30 milliradians acceptance half-angle, or even at least about 40 milliradians acceptance half-angle. However, with an angular range that is unnecessarily high, current may be wasted undesirably. Once a suitable accelerating voltage is chosen, the desired resolution may determine the acceptance angle of objective lens 100.

Moreover, detectors 190A-E from SEM and STEM embodiments, such as, for example, from FIGS. 1 and 2, respectively, may be provided concurrently in one embodiment of microscope 10. These may be provided, for example, to operate microscope 10 in simultaneous SEM and STEM modes or to allow relatively quick and easy switching between SEM and STEM modes.

The geometry of one or more of detectors 190A-C may be adapted to distinguish low-angle scattering from high-angle scattering in both forward and backscattering configurations to make contrast in the image depend on atomic number (Z). Detectors 190A-C may be located on the same side of sample 20 as electron beam source 30 or opposite to it. For example, in a STEM mode, detector 190A may be provided to operate in a HAADF mode in which high-angle electron beam 210A is detected, detector 190B may operate in a MADF mode, and detector 190C may operate in a bright-field mode in which axial electron beam 210B including a zero beam is detected.

Each of detectors 190A, 190B, if arranged in a substantially cylindrically symmetric geometry, may limit the scattered electrons to an angular range denoted here as $\varphi_d$, which defines an annulus between an inner angle $\varphi_1$ and outer angle $\varphi_2$. For an ADF mode these angles may be, for example, from about 25 mrad to about 60 mrad for $\varphi_1$, and from about 60 mrad to about 80 mrad for $\varphi_2$. For a STEM HAADF mode using detector 190A, these angles may be, for example, from about 60 mrad to about 80 mrad for $\varphi_1$, and greater than about 100 mrad for $\varphi_2$.

Figure 3A:
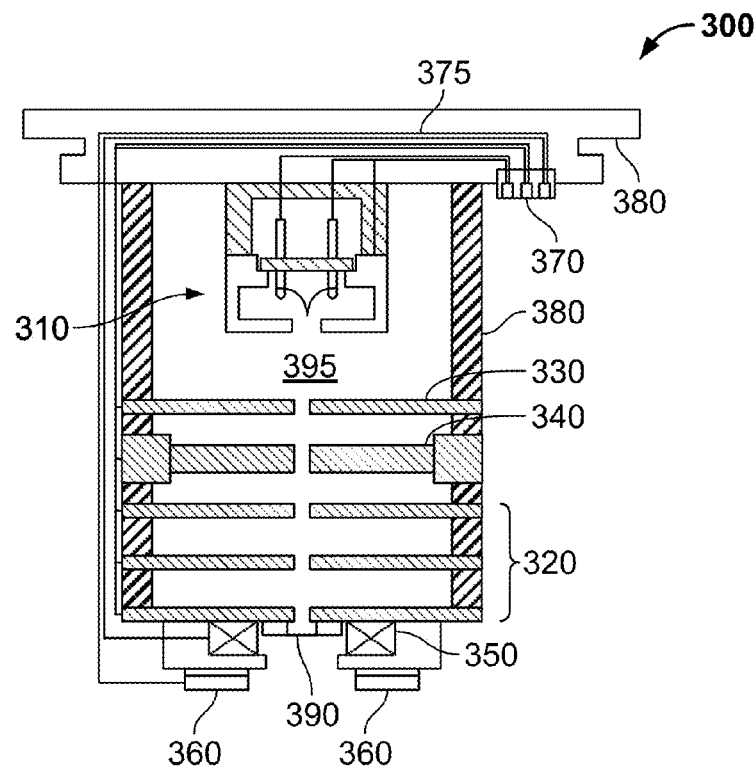
FIG. 3A is a schematic side view of an example of an embodiment of a sealed charged-particle column module.
Figure 4A:
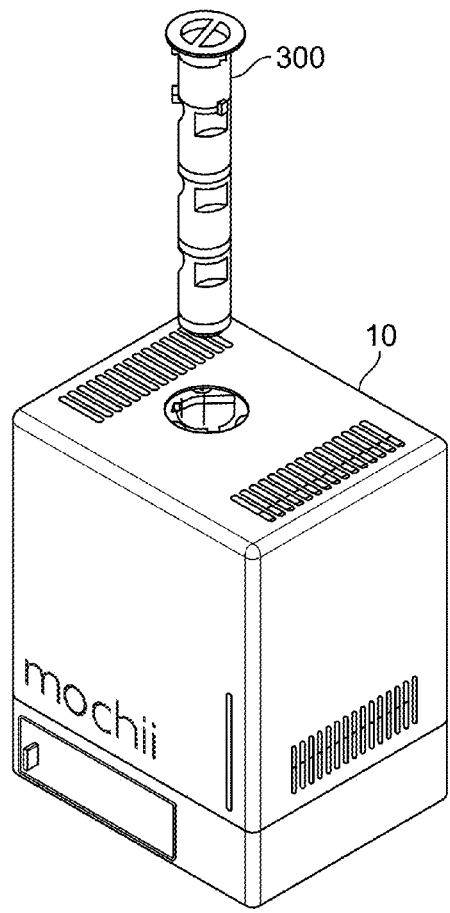
FIGS. 4A, 4B, and 4C are rendered perspective views of an example of an embodiment of a sealed charged-particle column module being inserted and locked into a charged-particle beam microscope.
Figure 4B:
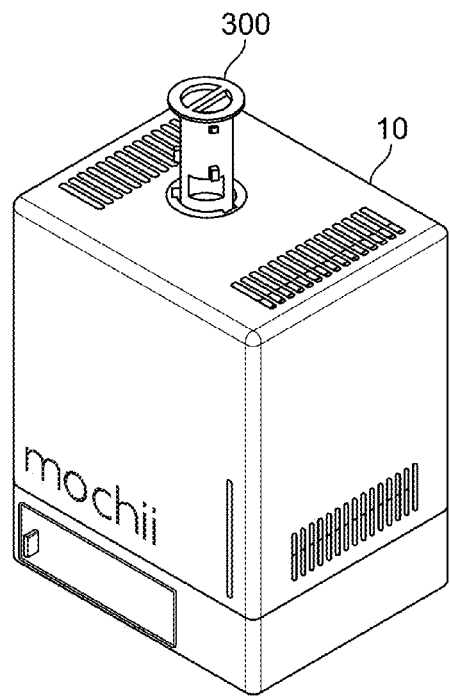
Figure 4C:
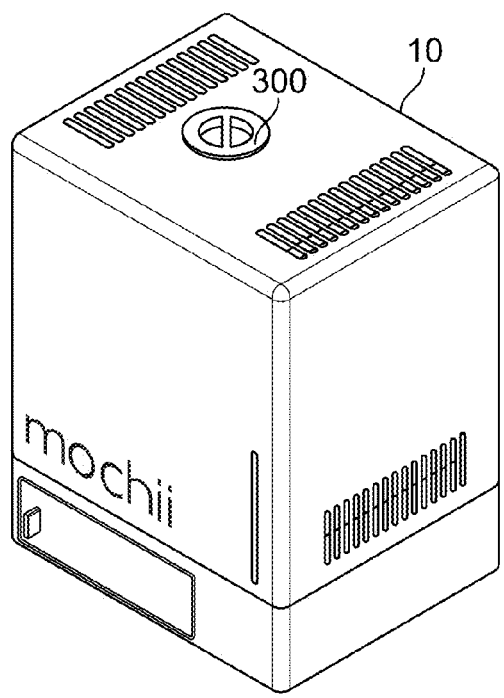

A sealed column module may be provided that contains elements of microscope 10, within an enclosure that is substantially sealed from an environment external to the column. Sidewalls of the enclosure may be made of an electrical insulator in one embodiment. The top of the enclosure, meanwhile, may be metal. The sealed column module may be adapted to be inserted and locked into the housing of microscope 10 and the microscope housing may similarly be adapted to receive the sealed column module and communicate signals to the column. The sealed column module may maintain a significant pressure difference between the volume inside the charged-particle column module and the external environment. The internal volume and the external environment may even have different species of gases or liquid. FIG. 3A illustrates an example of an embodiment of a sealed column module 300. FIGS. 4A-C show an example of sealed column module 300 being inserted into microscope 10.

Returning to FIG. 3A, sealed column module 300 may contain components of a charged-particle optical column, such as but not limited to a charged particle gun 310. Optical elements, such as lenses 320, shape the beam as it propagates through the column. The components may also include, for example, an accelerating aperture 330 (such as a first anode), a deflector-stigmator 340, beam scanners 350 that can scan the beam, and detectors 360.

Sealed column module 300 may have a feedthrough 370 that allows electrical signals to be conducted through enclosure 380 and into sealed column module 300, such that signals may be applied to the components inside sealed column module 300. For example, electric potentials may be applied, through feedthrough 370, independently to the gun 310 and optical components 320, 330, 340, 350, 360. Feedthrough 370 may have electrical leads 375 with exposed electrical contacts that couple to electrical contacts of the microscope housing when sealed column module 300 is inserted and locked into microscope 10. As an alternative to electrical signals, feedthrough 370 may be adapted to convey optical signals, such as through optical fibers embedded in feedthrough 370.

Sealed column module 300 may have an emission window 390 positioned after the final component contained within the volume 395 inside enclosure 380. Emission window 390 may be substantially opaque to gas particles while simultaneously being substantially transparent to the accelerated particles. To achieve these properties, emission window 390 may be fabricated to be very thin while having high strength. For example, emission window 390 may be fabricated of silicon nitride (SiN). The portion of emission window 390 that is substantially transparent to particles may be small in diameter to enhance its strength. Emission window 390 may be connected through a medium-to-high electrical resistance path to enclosure 380 so as to bleed off excess charge from passing charged particles, while not substantially diminishing the current of the charged-particle beam. Electrostatic lens elements, which may comprise disc-shaped elements having apertures along the beam path, may be used to structurally support emission window 390. This may substantially avoid introducing additional structural elements for mechanically supporting emission window 390 and therefore avoid structural complexity.

Certain optical components, such as components that are very near sample 20 during imaging, for example beam scanners 350, may be placed after emission window 390 and therefore outside of enclosure 380, but may still be part of sealed column module 300. Placing such components after emission window 390 may allow larger deflections than might otherwise be possible due to the limited diameter of the emission window. Alternatively, such optical components may be placed before emission window 390 and therefore inside of enclosure 380.

In one version, emission window 390 is energized with an electric potential to place a charge on axis of the beam. This charge on axis may be selected to alter aberrations or to correct deleterious aberrations from other parts of the optical system, thereby improving the resolution performance of microscope 10.

In the case of a tungsten filament, the overall differential pressure ratio between the inner volume 395 of charged-particle column module 300 and the external environment may be, for example, from about 10 to about $1\times10^{10}$, such as about $1\times10^2$. Inner volume 395 of column 300 may also have substantially different gaseous composition. For example, inner volume 395 may have a relative absence of water vapor or reactive elements in relation to the external environment. Alternatively, inner volume 395 may have a gaseous or liquid leak that provides replenishing, healing, or restorative elements to the optical elements in inner volume 395, such as to the filament area.

A sealed module containing a charged-particle gun system may be sealingly enclosed such that a pressure difference between different, or identical, species of gases or liquid can be maintained between an inner gun volume and the external environment. In the case of a tungsten filament, the overall differential pressure ratio may be 10 to $1\times10^5$, with a nominal value of $1\times10^2$. The inner volume may have a substantially different composition, for example, substantial absence of water vapor and reactive elements, in contrast to the external environment.

Figure 3B:
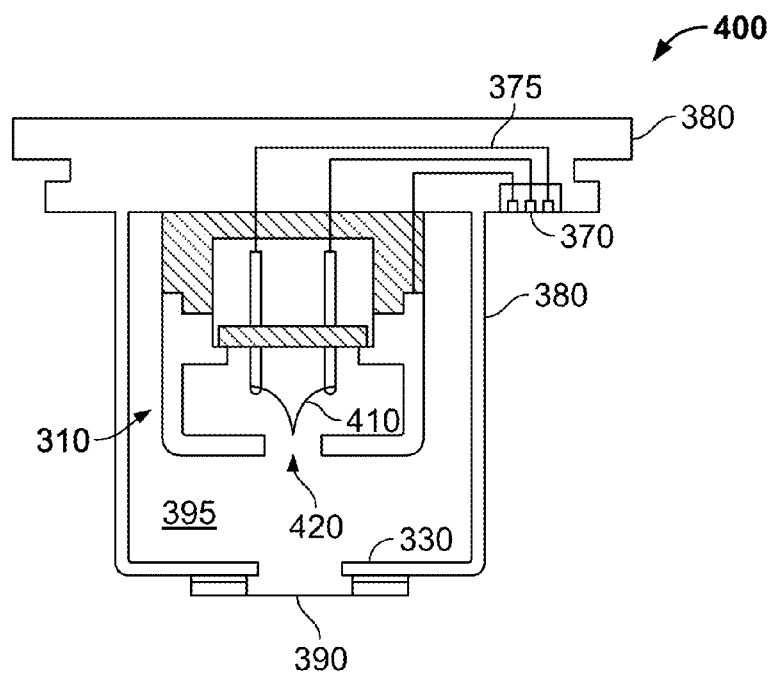
FIG. 3B is a schematic side view of an example of an embodiment of a sealed charged-particle gun module.

FIG. 3B illustrates an example of an embodiment of a sealed gun module 400. Sealed gun module 400 may contain the typical components of a charged-particle gun, including a filament 410, a Wehnelt aperture 420 used to focus the beam of emitted particles placed in close proximity to the filament tip, and accelerating aperture 330 (in this case a first anode) placed at a different potential from filament 410. The difference in potential between filament 410 and accelerating aperture 330 accelerates the particles emitted from filament 410 and sets their final energy, which they carry as they move through aperture 330. Typically, filament 410 is placed at a negative potential in relation to accelerating aperture 330. Furthermore, different acceleration devices may be used, such as a discrete set of accelerator plates with increasing potential applied to each plate sequentially, or a resistive accelerator tube with a potential placed at one end thus presenting a continuous potential distribution along the acceleration path. The particles emitted by filament 410 will be accelerated to the maximum potential and continue past accelerating aperture 330, forming a particle beam.

An emission window 390 is placed at or just beyond accelerating aperture 330. Emission window 390 is substantially opaque to gas particles and simultaneously substantially transparent to the accelerated particles. To achieve these properties, emission window 390 may be very thin yet have suitably high strength. The portion of emission window 390 that is transparent to the accelerated particles may be relatively small in diameter to enhance its strength. Furthermore, the high beam current passing through accelerating aperture 330 may locally heat emission window 390, driving contaminant deposits off of it and thereby cleaning it.

In one embodiment, an intermediate volume is used to achieve the desired difference in pressure between the inner gun volume and the external environment in stages, with each volume separated by a different emission window.

Feedthrough 370 allows electrical signals to be conducted to within enclosure 380, such that potentials may be independently applied to filament 410, Wehnelt aperture 420, and accelerating aperture 330. Emission window 390 may be connected through a medium-to-high electrical resistance path to accelerating aperture 330 so as to bleed off excess charge from passing particles, while not substantially diminishing the current of the charged-particle beam.

It may be desirable to protect the gun region, particularly the filament from gas attack due to high operating temperature, in order to prolong lifetime. For example, an intermediate volume may be used to achieve the desired difference in pressure between the inner volume 395 and the external environment in stages, with each volume separated by a different emission window.

Figure 5:
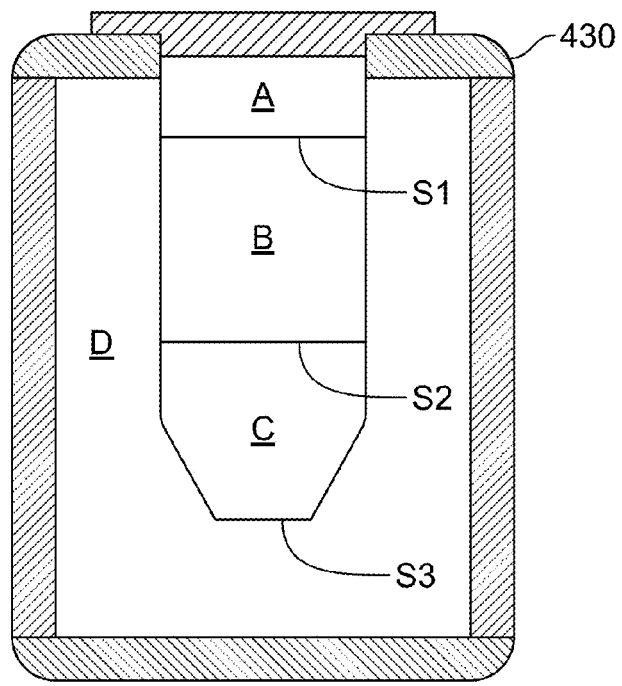
FIG. 5 is a schematic side view of an example of an embodiment of a charged-particle beam microscope that is maintained at different pressures at four different regions in the internal space of the microscope.

FIG. 5 illustrates an embodiment of an electron microscope 10 with a housing 430 showing an example of different vacuum zones in housing 430. A strong vacuum may conventionally be achieved in gun volume A. A good vacuum in the column and sample volumes B-D lengthens mean free travel path and prevents scattering of the charged-particle beam, enhancing the signal.

Free radicals present in volume A may attack charged-particle source filament, causing accelerated erosion of filament and causing regions of filament to have reduced physical cross-section. The increased resistance due to this reduced cross-section causes local excess heating, which further accelerates the erosion.

Simultaneously, the high temperature in the gun region may cause cracking of volatile compounds in the vicinity of filament, generating additional free radicals which also contribute to excess erosion. These processes can lead to premature failure of filament.

High signal and high resolution are desirable properties to have in the particle beam. Scattering in gas has the effect of reducing signal of the beam by scattering away current from the forward direction. Typically, however, such scattering does not reduce the resolution of the beam. The sample volume D may have the poorest vacuum in the system, often several orders of magnitude poorer (i.e., higher pressure) than in the column and gun volumes, since this volume is often brought up to atmosphere when the sample is introduced and then pumped back to operating vacuum before operation. Often the sample will also contain some volatile elements or have water vapor adsorbed onto it. Thus, volume D with the generally poorest vacuum generates the greatest loss along the beam path due to scattering.

It is therefore advantageous to separate the volumes using various volume separators, shown here as elements S1-3. These volume separators may be, for example, small apertures that limit gas flow between volumes, thin membranes isolating volumes, or a combination thereof.

In one embodiment of differential vacuum modes, S1-3 are apertures. These apertures may be referred to as differential gas flow apertures. These apertures may be, for example, 0.5 mm aperture inserts, or 1 mm apertures which form electrodes of lenses. Differential gas pressure would typically cause a jet of gas particles traveling from the volume with higher pressure toward the volume with lower pressure, and such a gas jet can exacerbate beam scattering locally until the beam passes substantially through the jet. These small apertures S1-3, however, may limit the gas flow between volumes, due to their small size, and thereby mitigate such gas flows to suitable levels.

The charged-particle beam need not necessarily travel through the centers of differential gas flow apertures S1-3, or through these apertures at all. Any of apertures S1-3, for example, may be auxiliary to and placed apart from a separate and smaller aperture that is provided for the beam path. In another example, a suitably thin beam-transmission membrane is provided instead of an aperture. In these examples, apertures S1-3 may still provide the majority of differential-equilibrating gas-flow-minimizing impact to the beam.

In sealed volume modes, elements S1-3 themselves may be thin gas-impermeable membranes that are substantially electron-transparent, holding the difference in pressure and substantially eliminating the gas jet.

In order to reach pressures of less than about $1\times10^{-2}$ Torr in a particular volume, a turbo-molecular pump, or molecular drag pump, diffusion pump, or other suitable high-vacuum pump, may be used for that volume, in addition to a roughing pump. In order to reach pressures at least as low as about 1 Torr in a particular volume, meanwhile, only a roughing pump (e.g., diaphragm pump, scroll pump, or rotary vane pump) may be used. The microscope may be able to operate with volume D at atmospheric pressure (i.e., about 760 Torr).

Examples of a few embodiments of the vacuum system include:

Example 1: Conventional EM Mode a. $A=B=C=D\approx1\times10^{-4}$ to $1\times10^{-5}$ Torr Example 2: Differential Two-Volume Mode a. $A=B=C<<D$
b. Where A, B, $C\approx1\times10^{-4}$ to $1\times10^{-5}$ Torr, and $D\approx10$ Torr to $1\times10^{-3}$ Torr Example 3: Differential Three-Volume Mode a. $A<B=C<D$
b. Where $A\approx1\times10^{-4}$ to $1\times10^{-5}$ Torr, $B,C\approx1\times10^{-2}$ to $1\times10^{-3}$ Torr, and D~10 to $1\times10^{-3}$ Torr Example 4: Differential Four-Volume Mode a. $A<B<C<D$
b. Where $A\approx1\times10^{-4}$ to $1\times10^{-5}$ Torr, and D~10 to $1\times10^{-3}$ Torr Example 5: Sealed Gun Volume, Equivalent Pressures a. $A\sim1\times10^{-2}$ Torr, containing inert gas
b. $B=C=D\approx1\times10^{-2}$ Torr Example 6: Sealed Column Volume, Equivalent Pressures a. $A=B=C\approx1\times10^{-2}$ Torr, containing inert gas
b. $D\approx1\times10^{-2}$ Torr Example 7: Sealed Gun Volume, Disparate Pressures a. Same as Example 5 above, non-inert gas volume~100 to $1\times10^{-2}$ Torr Example 8: Sealed Column Volume, Disparate Pressures a. Same as Example 6 above, non-inert gas volume~100 to $1\times10^{-2}$ Torr 9. Combination Sealed/Differential, Disparate Pressures
a. $A\sim1\times10^{-2}$ Torr, containing inert gas
b. $B\leq C\leq D$
c. D may be as high as atmospheric pressure Microscope 10 may additionally contain a compact evaporator to prepare the sample by evaporating metal or another contrast-enhancing agent such that the evaporant deposits onto the surface of the sample. The compact evaporator can be a component of microscope 10, and, when placed together with sample 20 inside the chamber of microscope 10, can accomplish the evaporation onto the sample in situ.

Figure 6A:
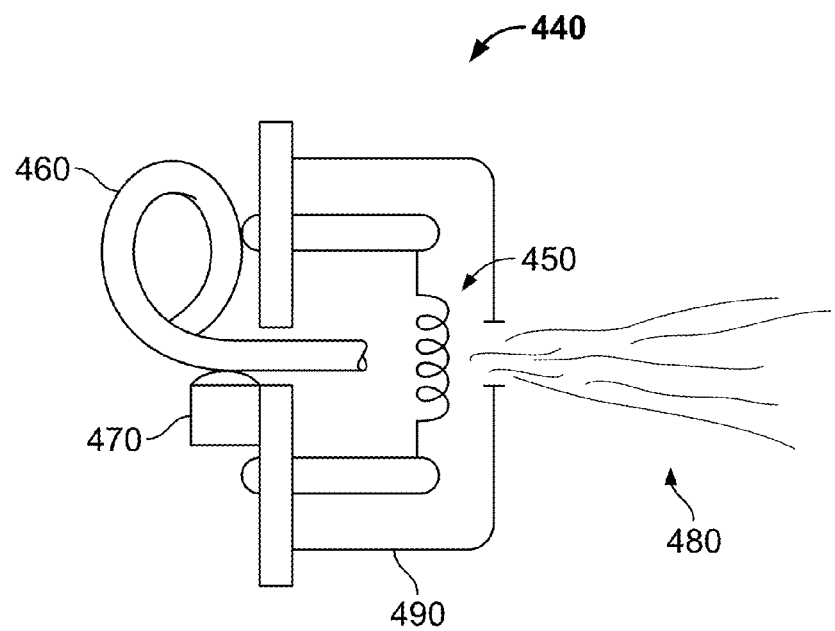
FIG. 6A is a schematic side view of an example of an embodiment of a compact evaporator.

FIG. 6A illustrates an example of an embodiment of a compact evaporator 440. Evaporator 440 may have a heated filament 450 and a reservoir of evaporant wire 460. Evaporant wire 460 may be in spool or rod form, for example. A motor system 470 may advance evaporant wire 460 onto heated filament 450, whereupon heated filament 450 melts wire 460 and wicks it into filament 450, from which the wire material is evaporated (as evaporant 480 shown in the figure). Evaporator 440 may also have a shield 490 to prevent over-spray of evaporant 480 and to direct evaporant 480 onto the sample. Shield 490 may have a cowl of aperture over filament 450 to achieve this. Further, evaporator shield 490 may protect the detectors from the spray of evaporant, which could otherwise become coated with evaporated material; this can enable live detection of sample 20 and monitoring of the evaporation and deposition process. A human user may thus be able to monitor and throttle evaporator 440 so as to select the amount of evaporant that is to coat sample 20.

Figure 6B:
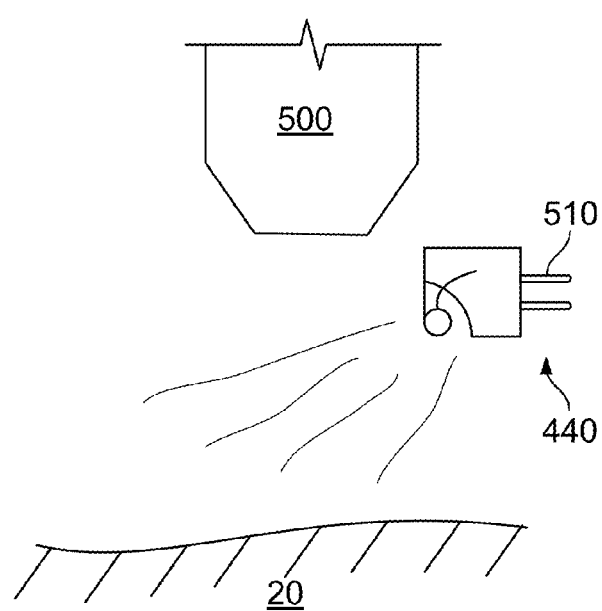
FIG. 6B is a schematic side view of an internal region of an example of an embodiment of a charged-particle beam microscope having a compact evaporator.

Evaporator 440 may be compact and enclosed in a small form factor, making it suitable for being installed inside the chamber of microscope 10. For example, evaporator 440 may have a form factor of from about 1×1×1 cm to about 3×3×3 cm in size, such as about 2×2×2 cm in size in one embodiment. FIG. 6B illustrates an example of an embodiment in which evaporator 440 is located inside the chamber of a microscope, at a location that is vertically between the microscope column 500 and sample 20. This figure also shows that evaporator 440 may have electrical terminals 510 to receive power.

Furthermore, a scanning light microscope (SLM) module may be provided inside microscope 10 and communicatively coupled to controller 10 to provide a hybrid scanning light and charged-particle beam microscope that has novel and synergistic features.

The SLM may include a laser module with optics to produce a small focused spot on a sample. A scanning module that contains scanning elements, such as minors which tilt in multiple axes, positions the beam spot on sample 20. The beam is scanned in a pattern on sample 20, and a detector detects the signal produced by the interaction of the beam with the sample. This signal may include reflected light or a fluorescent signal.

In a combination scanning light and charged-particle microscope, both types of scanning microscopes are included in a single system. For both scanning microscope types, the distance of the focused spot from the final optical focusing element is referred to as the "working distance." The system may be light-insulated from the external environment so as to avoid detection of stray light from the environment. It may also, but not necessarily, be enclosed in a vacuum to prevent scattering of charged particles by gas molecules or ions. The SLM module may also detect reflected color by using filtered detectors or different colored laser beams.

Advantages include that one scanning system and one detector system can be shared between both optical systems. Furthermore, the hybrid microscope can provide disparate fields of view: (1) a scanned light field of view, which may be a larger field of view that allows a high-speed survey at lower magnification and lower resolution, and (2) a scanned charged-particle field of view, which may be a smaller field of view that allows higher magnification and higher resolution. The hybrid microscope may also permit colocalization of light-optical and charged-particle signals, from the same sample, optionally at the same time. For example color information at low resolution from the scanning light microscope could be combined with high resolution contrast (grayscale) information from the charged-particle microscope.

Further, sample 20 may be tagged (or "labeled") with compounds (also referred to as "tags" or "markers") that have affinity to certain types of structures, and upon excitation by a laser or electron beam the tag compound may fluoresce. As one example, a compound tag may be attached to a protein receptor on the surface of a cell. This fluorescence signal can enable identification and pinpointing of spatially fine structures by multiple scanned imaging modalities operating optimally at different length regimes. Sample 20 may be probed by both light and charged-particle optical systems in succession, or in parallel, so as to take advantage of the variety of signals that microscope 10 makes available in this combination.

In one version, microscope 10 is a scanning charged-particle beam microscope, such as, for example, a STEM or SEM. FIG. 7A illustrates an example of an embodiment of a hybrid SLM-SEM 520A. In this example, a scanning light microscope module 525 has a laser module 530 that is placed perpendicular to charged-particle column 500 of microscope 10. This allows it to be placed outside of the inner vacuum space of microscope 10, and coupled to vacuum space by a transparent window 540. Module 525 also includes optical elements 535 to direct and scan the laser beam onto sample 20.

In an alternative embodiment, shown in FIG. 7B, laser module 530 is placed parallel to charged particle column 400, either to the side of (and within the vacuum space) or above column 500 (and outside the vacuum space), coupled similarly by a transparent window 540). This enables a more compact arrangement and places the optics of scanning light microscope module 525 away from the region of sample 20, freeing up room for detectors and sample-treatment devices or other devices. Again, module 525 also includes optical elements 535 to direct and scan the laser beam onto sample 20. In FIG. 15B, the hybrid SLM-SEM also contains a compact evaporator 440.

FIG. 7C illustrates an example of an embodiment of laser module 530. In this example, laser module 530 has a laser source 550 and a lens 560 that generate a focused laser beam 570.

FIG. 7D illustrates an example of an embodiment of respective fields of view of SLM 525 and charged-particle beam portion of microscope 10, respectively, on sample 20. SLM 525 has larger field of view 580, while the charged-particle beam portion of microscope 10 has smaller field of view 590. This illustrates the potential advantageousness of the larger field of view 580 of SLM 525.

Microscope 10 may include or be connected to a power supply (not shown) that provides power to components of microscope 10, such as a charged-particle beam source (e.g., electron beam source 30), condenser lenses (e.g., condenser lenses 70A-C), the objective lens (e.g., objective lens 100), the detectors (e.g., detectors 190A-E), and the stage (e.g., stage 15). The power supply may include one or more individual power supplies, such as set to different voltages or otherwise taking different forms. The power supply also provides power to the pumps of microscope 10, and to any other components of microscope 10 that consume power. In one embodiment, the optical system of microscope 10 has a total power consumption for all such components of less than about 2.5 kW. In another embodiment, designed for power efficiency, microscope 10 may have a total power consumption of less than about 1 kW.

The power supply can provide one or more voltages to accelerate the charged-particle beam. In one version, the power supply includes at least one high-voltage supply, which may be used for a number of lenses. A single high-voltage supply that may be used to provide the primary beam energy can be modified with resistors to provide multiple values to different lenses that are at a ratio of the primary high-voltage value of the high-voltage supply. These resistors may be either constant or programmable by the controller. In this manner, instabilities that may be present in the high voltage signal can be provided substantially equally to the multiple lenses and the effects of the instabilities can be lessened. The power supply may also include one or more low-voltage supplies, such as to provide lower voltages to non-round lenses, such as dipoles, quadrupoles, and octupoles.

An embodiment of microscope 10 that incorporates electrostatic lenses, fixed-magnet lenses, or hybrids thereof, in optical components, may be able to consume more than an order of magnitude less power than a conventional charged-particle microscope. Such a very-high-efficiency microscope may be capable of a total power consumption of less than about 100 W. An example of a very-high-efficiency electron microscope is the "Mochii" microscope available from Mochii, Inc., of Seattle, Wash.

Microscope 10 may include a controller to control operation of microscope 10. The controller may, for example, receive inputs from a human user, provide instructions to microscope 10, and/or perform data processing of images generated by microscope 10. The controller may automatically control one or more aspects of operation of microscope 10, and may even be adapted to entirely automate the operation of microscope 10. The controller may control the components of the optical system of microscope 10, such as beam scanners (e.g., beam scanners 170) and the stage. Alternatively or in addition, the controller may receive one or more images from the detectors (such as detectors 190A-E) to be processed computationally. For example, the controller may process collected data and/or process any desired images. The controller may include an image formation unit for this purpose. The image formation unit may be disposed within or external to the microscope column and communicate with the optical system and the stage in any fashion, such as by a direct or indirect electronic coupling, or via a network.

The controller may include one or more microprocessors, controllers, processing systems, and/or circuitry, such as any combination of hardware and/or software modules. For example, the controller may be implemented in any quantity of personal computers, such as IBM-compatible, Apple, Macintosh, Android, or other computer platforms. The controller may also include any commercially available operating system software, such as Windows, OS/2, Unix, or Linux, or any commercially available and/or custom software such as communications software or microscope monitoring software. Furthermore, the controller may include one or more types of input devices, such as for example a touchpad, keyboard, mouse, microphone, or voice recognition.

The controller software, such as a monitoring module, may be stored on a computer-readable medium, such as a magnetic, optical, magneto-optic, or flash medium, floppy diskettes, CD-ROM, DVD, or other memory devices, for use on stand-alone systems or systems connected by a network or other communications medium, and/or may be downloaded, such as in the form of carrier waves, or packets, to systems via a network or other communications medium.

Figure 8:
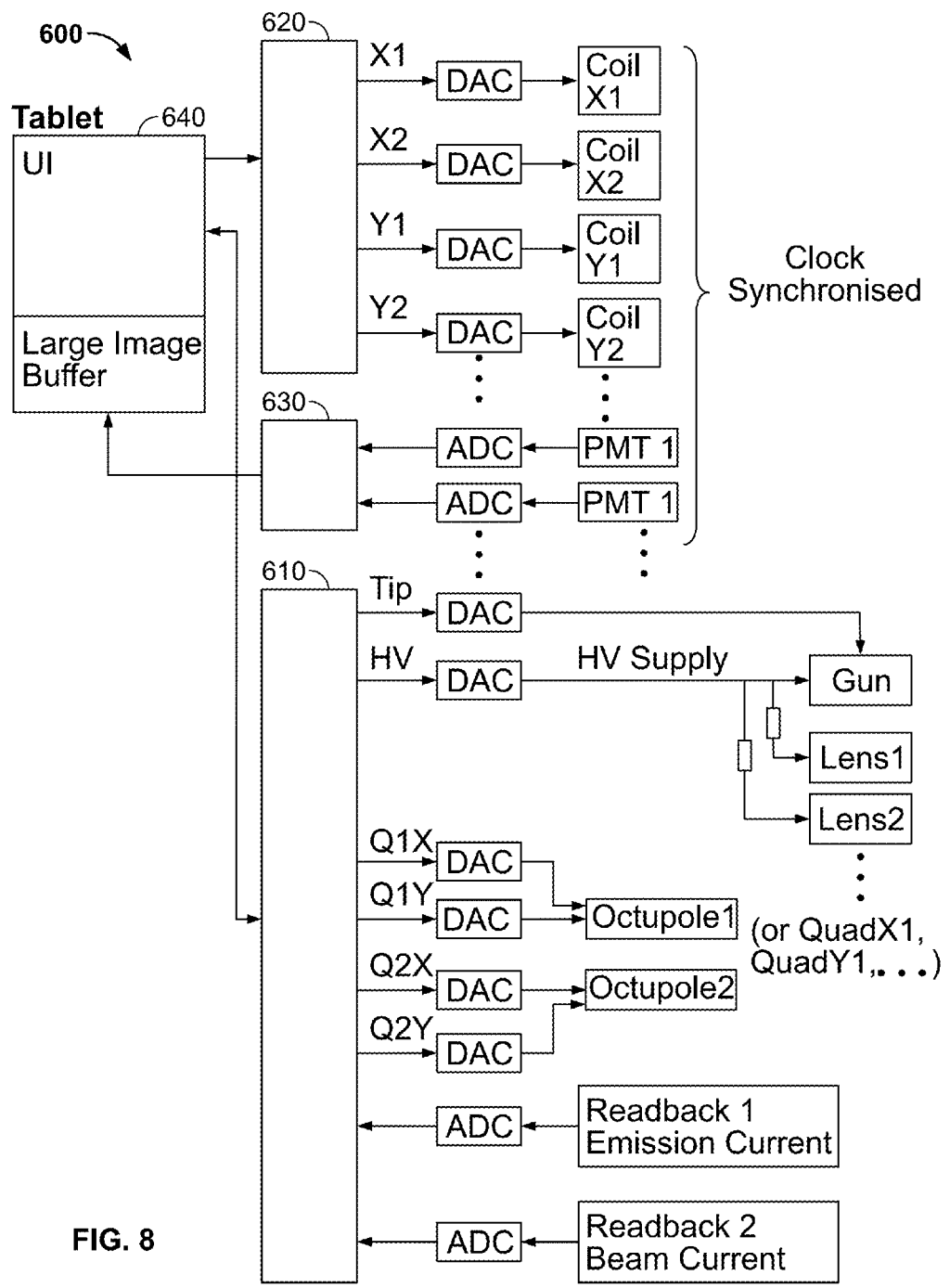
FIG. 8 is schematic diagram of an example of an embodiment of a controller of a charged-particle beam microscope in communication with a user interface.

FIG. 8 illustrates an example of an embodiment of at least a portion of a controller 600. Controller 600 may include a lens control unit 610 for setting and reading back pertinent values relating to electron beam lenses. It can be digital and provide digital signals converted to analog via digital-to-analog converters (DACs). It can control a number of supplies and a supply can provide voltages to a number of elements. It can read back values from external sensors. The interface can set the controls or specify a preset set of values. Read-back values can be sent to the interface, or interpreted by the controller and the interpreted values returned. These could be that values are good, marginal or bad, or more. The read-back values may, according to logic in controller 600, change the outputs of controller 600.

For example, the voltages provided by the power supply control unit may be digitally controlled and converted to analog signals via DACs. Read-back values provided to controller 600 may include one or both of the emission current and the beam current. These analog signals may be converted to digital signals using analog-to-digital converters (ADCs) at controller 600.

Yet another of the controller components may be a scan generator unit 620 that provides a time-dependent set of voltages to send to a number of beam scanners (such as beam scanners 170). The voltages can be provided as digital signals converted to analog signals by a DAC for each channel.

In addition, the components of controller 600 may include a signal acquisition unit 630 to read back data from a number of signals from microscope 10, which optionally may be synchronized with scan generator unit 620. The number of signals may be, for example, from about one to about four. Furthermore, as an illustrative example, signal acquisition unit 630 may be synchronized for one reading per scan location, but may alternatively take more than one reading per location or one reading per multiple locations. The resulting data can be digitally sampled using an analog-to-digital converter (ADC) and stored quickly in a local image buffer. This buffer may be requested from the user interface, or parts of it requested.

The data may be sent compressed, either lossy or lossless. The data may also be sent as the scan is continuing to provide partial information before the scan is complete. The exact values for the scan locations could be set from user interface 640, or simpler parameters can be set from user interface 640 with scan generator unit 620 calculating the exact locations itself. In one embodiment, user interface 640 provides its own data buffer for storing images, so that the buffer size in signal acquisition unit 630 can be reduced. The throughput of data that emerges from the microscope detectors may be substantial, such that electronics capable of dealing with this data throughput downstream of the detectors may be desirable.

Microscope 10 can be controlled using at least one user interface (UI) communicating to various components of microscope 10, such as via controller 600. The components that can be controlled by the user interface may include, for example, lens control unit 610, scan generator unit 620, and signal acquisition unit 630. Either all or a subset of the functionality of each component may be exposed to the UI. The UI may automatically make changes to the components based on information it receives from the user, from other components, and/or at certain times or locations. The UI may offer a simplified way to control various components of microscope 10.

Figure 9:
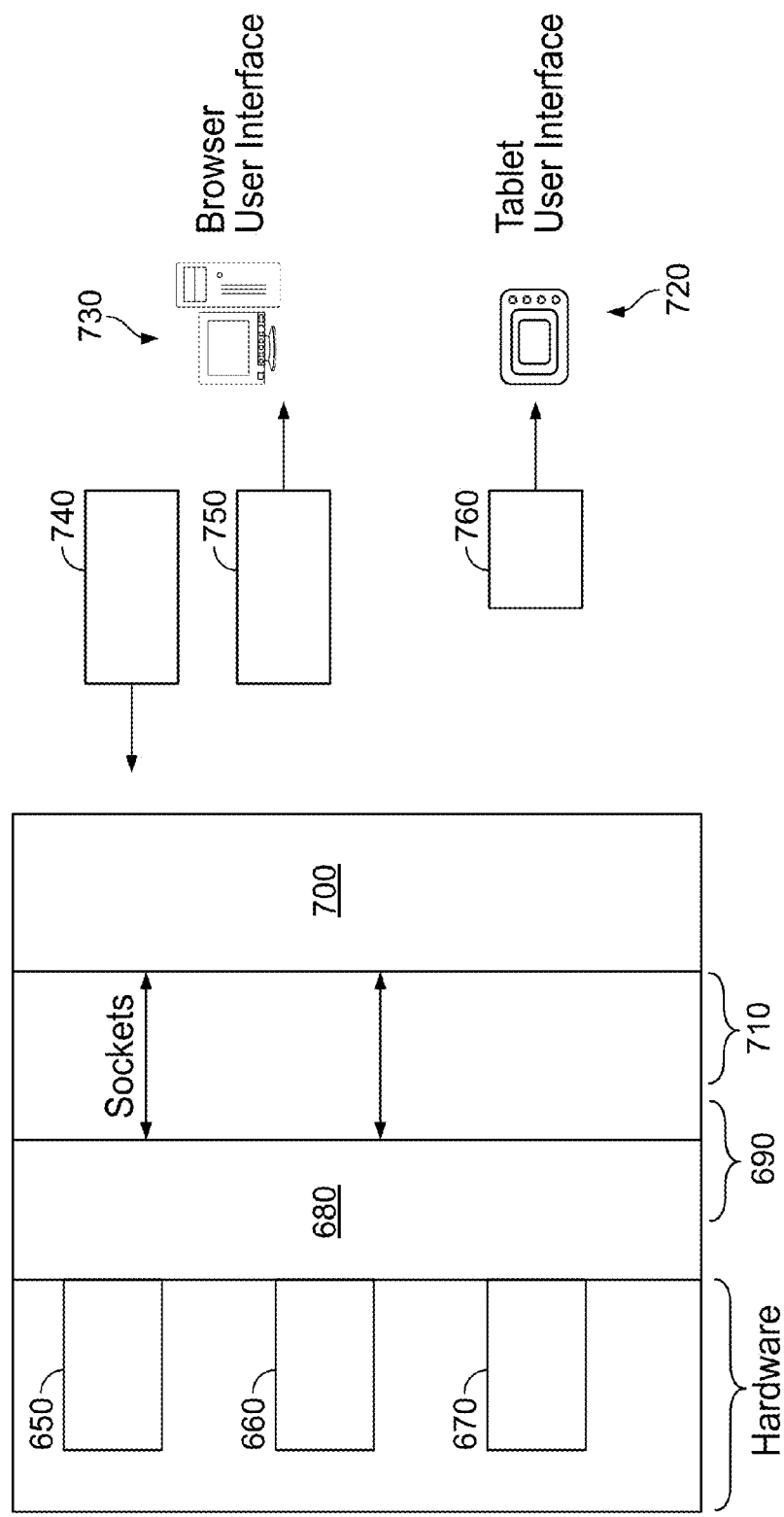
FIG. 9 is a schematic diagram of an example of an embodiment of a controller of a charged-particle beam microscope in communication with a user interface, showing logical layers of the controller.

The microscope may be described as a logical series of layers, wherein each layer talks to the ones above and below it. These different layers may communicate with each other through software or hardware, and either locally or remotely, such as over a network. For example, layers may include physical hardware. In this sense, the microscope may have hardware at its lowest layer. An example of an embodiment of an architecture for controlling a microscope is illustrated in FIG. 9.

In this example, hardware may include instrument control, acquisition control, and system health facilities 650, 660, 670, respectively, for ensuring smooth operation. Above this may be a "control process" layer 680 that contains the low-level processes for operating the instrument. This could provide a low-level set of routines (i.e., "control code" 690) to the layer above.

Above this could be a "user-facing" layer 700, exposing an application program interface (API) 710. API 710 would provide safe access to a subset of the control process low-level routines. The instrument may be fully controllable for all day-to-day operation from API 710. API 710 could be exposed to the human user via a UI. The UI may include, for example, a graphical user interface (GUI). The human user can interface directly with layer 700, such as through a web browser, or via another layer, like a dedicated app running on a consumer device providing a secondary UI. If the user-facing layer 700 includes a web server, the UI presented could be dependent on the type of device used to access it.

The UI could have different versions for tablets 720 and desktop computers 730, for example.

It is possible to formalize the communication between the layers as a data structure. In one embodiment this occurs between the user interface and the user-facing layer/API. This data structure may be sufficient to describe the high-level state of the microscope at any time, through multiple independent and asynchronous data channels. For example, the data structure may include:

Column Configuration Data 740: This gets sent to the instrument, and describes the values of the lenses, state of any valves, etc.

Column Health Data 750: This is returned from the instrument and contains the current read-back state of it.

Image or Video Stream Data 760: This provides images and videos from the acquisition module of the instrument.

The column configuration and health data 740, 750 may be relatively small and not needed to be transmitted particularly quickly (for example, 10 Hz may be sufficient in one embodiment) and may therefore be low bandwidth (such as, for example, less than about 10 kB/s). The image or video stream data 760, on the other hand, may require more bandwidth (such as, for example, at least about 1 MB/s), although compression techniques may be used to reduce this.

Figure 10A:
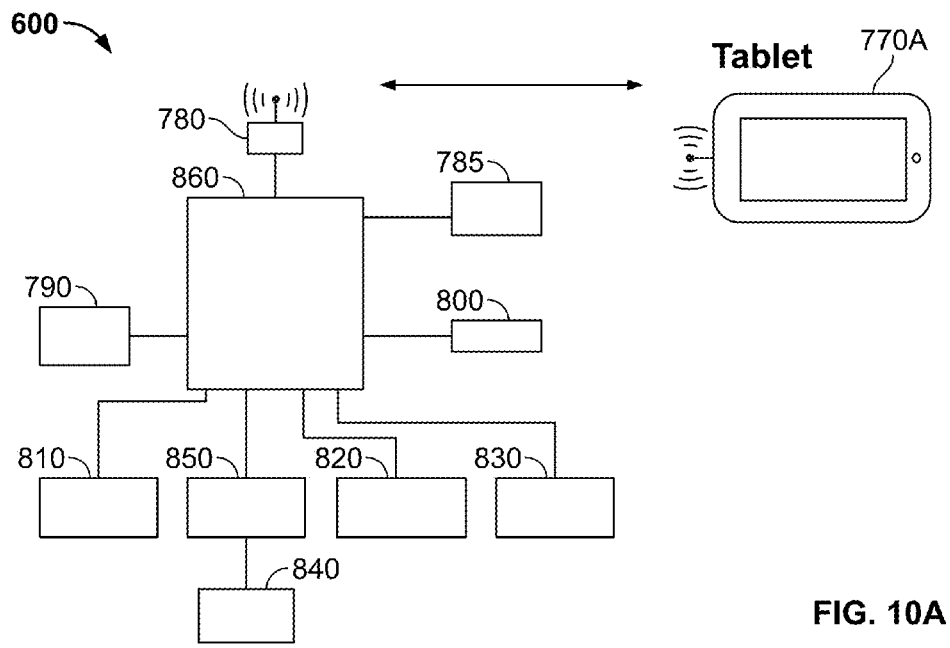
FIGS. 10A and 10B are schematic diagrams of exemplary embodiments of a controller of a charged-particle beam microscope in communication with various types of client devices having respective user interfaces.
Figure 10B:
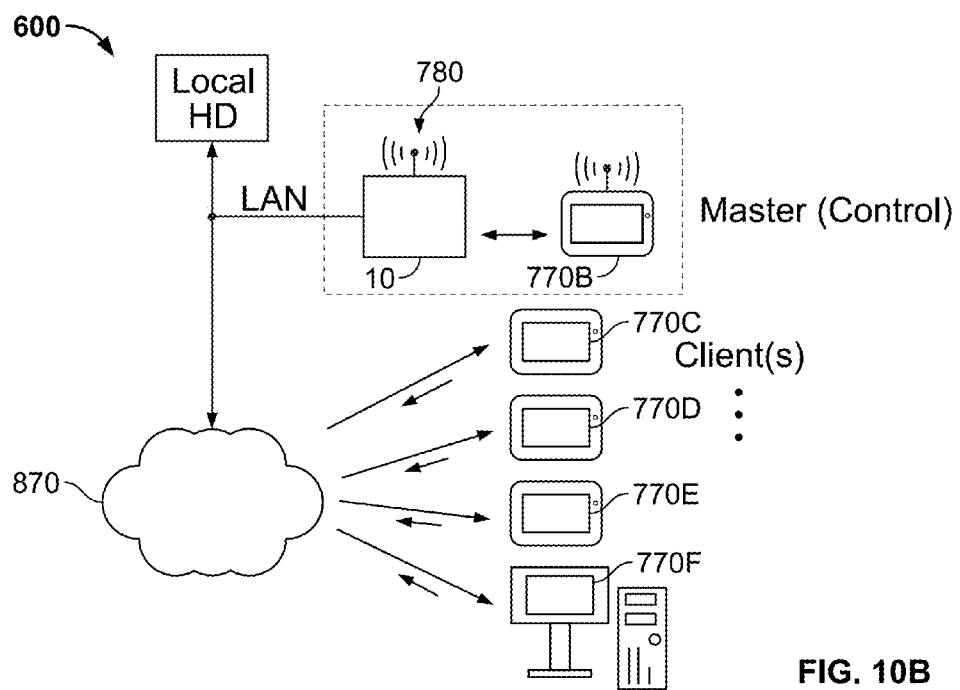

FIGS. 10A and 10B illustrate embodiments of architectures by which a UI running on one or more local or remote client devices 770A-E can control microscope 10. Controller 600 can be attached to a wireless access networking device 780 (such as via Wi-Fi or Bluetooth) or other access or networking device, such as a landline networking device 785, allowing any of the modules to be located remotely. Any of client devices 770A-E may be, for example, a tablet, smartphone, personal computer, watch, goggles, or a consumer device, which communicates with controller 600.

Controller 600 may allow certain functionality to be controlled from the client devices 770A-F. Controller 600 may have full control over microscope 10 through discrete modules of controller 600. These modules may include, for example, a power supply control module 790, a storage unit 800, a lens control unit 810 for setting optical parameters, a scan generator unit 820, an image acquisition unit 830, a vacuum-system control unit 840, and a system health unit 850. Controller 600 may have a centralized CPU 860 controlling each of the units 790, 800, 810, 820, 830, 840, 850 and channeling communication between them.

System health unit 850 may contain other sub-units and may communicate with other modules to monitor their health. Monitoring health refers to checking that the components of microscope 10 are operational and functioning properly. System health unit 850 may send messages to other units with specific commands to follow or with general health reports which each module can interpret as it sees fit.

FIG. 10B illustrates another embodiment of an architecture by which client devices 770B-F can control microscope 10. It may be desirable to give a master (i.e., control) client device 770B high responsiveness and therefore prioritize it for bandwidth usage. For example, master (control) client device 770B may be connected directly to controller 600 using a hard connection or wireless. Whereas bandwidth over wireless may be limited, potentially restricting the number of simultaneous connected consumer devices, the latency of the local connection may be very low, thereby enabling the high responsiveness that is desired.

Affiliate client devices 770C-F connecting using a cloud service 870 to monitor microscope 10 may have high bandwidth but low latency. The high bandwidth can enable a large number of users to connect simultaneously, even as the responsiveness may be diminished. For example, bandwidth priority can be managed so that controlling users are given priority over monitoring users. Even so, control or monitoring of microscope 10 is enabled for a large number of users. Furthermore, cloud service 870 may provide off-site storage for client devices 770C-F.

During operation of microscope 10, there can be multiple channels of communication between the server and the client devices 770C-F. These could include transmitting images from microscope 10 to the client devices 770C-F and sending instructions from the client devices 770C-F to controller 600. Controller 600 may support multiple, independent, asynchronous channels that allow these channels to operate in parallel. This allows, for example, commands to be sent to one of client devices 770C-F at the same time that data is being received from the same client device. Because the channels operate in parallel, there is no need to wait for one channel to finish before data can be sent, received, and processed on a separate channel. By making the channels independent, they can also be optimized for the type of data they send. For example, a channel for sending image data could be optimized for high-bandwidth, while a channel for sending commands to the device could be optimized for low-latency.

It may be desirable to have microscope 10 be readily available to a human user at any time. Yet, at the same time, there may be detrimental effects to having microscope 10 turned on all the time. These detrimental effects may include, for example, limited lifetime of components, cost of operation, or, in remote-use applications, limited available power.

To address these issues, microscope 10 may be started up and shut down substantially automatically and in a manner that is substantially transparent to the user.

Figure 11:
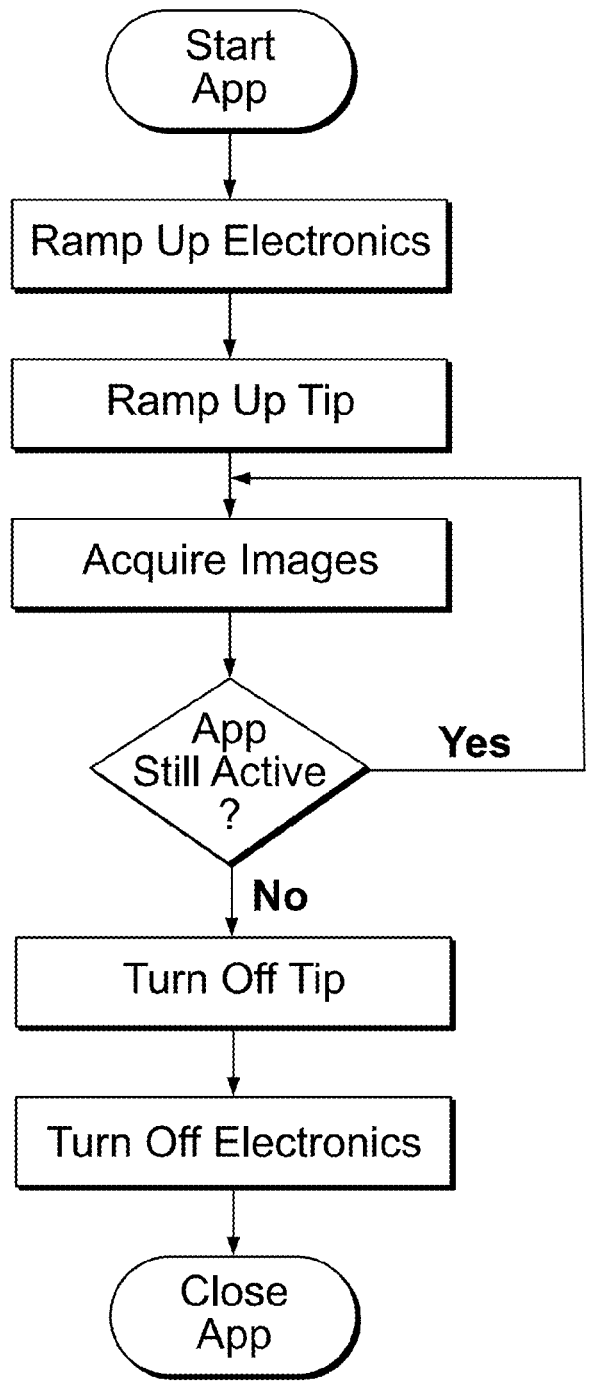
FIG. 11 is a flowchart of an example of an embodiment of a method for starting up a charged-particle beam microscope.

In one example, which corresponds to the flowchart in FIG. 11, automatic startup and shutdown of microscope 10 may involve these steps:

Step 1: The user opens a client interface. This may involve starting an application on a consumer device or visiting or logging into a website.

Step 2: The main systems for controlling the system are automatically tuned on.

Step 3: Any secondary systems, typically dependent on the primary systems, are turned on.

Step 4: Step 3 is repeated for any extra systems until the whole machine is successfully turned on.

Step 5: The instrument is ready to run now. The user can interact with it as normal.

Step 6: Regular use continues until the client interface is closed or paused. This could be an app being closed/hidden/paused or logging out or leaving a website. This could also occur after a set period of time.

Step 7: The systems in steps 3 and 4 are turned off in an appropriate order

Step 8: The electronics turned on in step 2 are turned off.

It may be advantageous for the steps above to have error checking at each level so that if any error occurs the appropriate steps are taken, which may include reversing some or all of the previous steps taken.

It may also be possible for the machine to only partially shut down (e.g., only some of the systems in step 7 are turned off, and step 8 is skipped), and then turned on again more quickly (e.g., by starting at step 2 or 3 instead of 1).

Microscope 10 may have a characteristic area at the plane of sample 20 in which optical characteristics, such as, for example, resolution, are selected to be within a range suited to the imaging that is performed. This area may be referred to as the "field of view" of microscope 10. Within the field of view, the charged-particle beam may be scanned in one or more scanning areas across sample 20 by electronic shifting, such as by generating an electric or magnetic field, while remaining within the desired range of optical characteristics (such as high resolution).

Within each field of view, microscope 10 may define one or more scanning areas in which the charged-particle beam will be scanned to contribute to the final image. Microscope 10 may perform the imaging of sample 20 in one or more cycles corresponding to the scanning areas, each imaging cycle for a scanning area yielding a contribution that is referred to here as a sub-image. Each scanning area may be noncontiguous, contiguous, or overlapping in relation to scanning areas within the same field of view or scanning areas in different fields of view. Moreover, the scanning areas may even be a combination of noncontiguous (i.e., with edges separated by a space), contiguous (i.e., edge to edge), or overlapping.

The controller may stitch together the sub-images to produce a partially or wholly comprehensive image of sample 20. For example, where there are overlapping or contiguous sub-images, these sub-images may be joined together to yield imaging data that is continuous across the corresponding scanning areas. For overlapping sub-images, the controller may use the redundant image information at the overlap to accurately join the sub-images together into a comprehensive image. The controller may automatically control the acquisition of sub-images along a set path, for example a raster pattern or a zig-zag pattern. Further, new data may automatically be integrated into a large map (e.g., a map of substantially the whole sample) as sub-images are acquired so as to fill in the large map with available information.

In a scanning charged-particle beam microscope, such as STEM or SEM, the precise paths along which scanning of the charged-particle beam probe occurs may even be defined according to the particular application. For example, the location of the beam can be set to any position, for any time duration, along the scan path. This is in contrast to conventional raster scans in which the scans typically increase linearly in one direction (the fast direction, say along an "x" axis) followed by a linear step in a "y" axis, with the position of the beam along the "x" axis returning to its starting location, and then again moving along the "x" axis until all intended positions have been visited by the beam. In such conventional raster scans, the duration spent at each location is typically identical and the incremental displacements of the beam along the "x" and "y" axes are also typically identical.

With the ability to perform predefined scans, various scanning techniques can be used. For example, the techniques in the embodiments described below may be used individually or in any suitable combination.

Figure 12A:
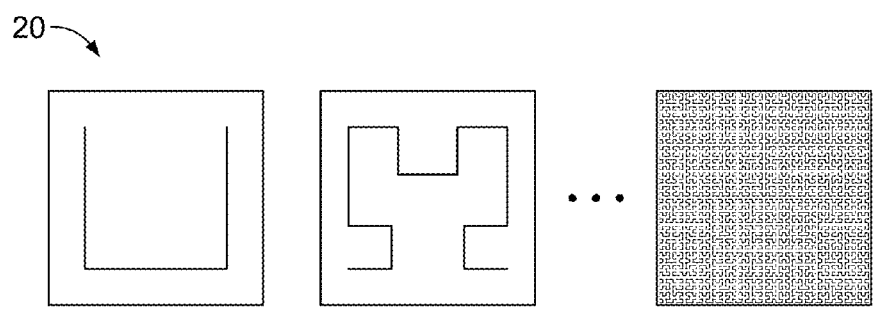
FIGS. 12A, 12B, and 12C are schematic diagrams of different exemplary embodiments of modes in which a charged-particle beam microscope may scan a charged-particle beam across a sample to achieve various desired results.

In one embodiment, controller 600 is adapted to control the beam scanners to scan a beam probe along one or more space-filling curves. These space-filling curves may include, for example, a Hilbert curve, Peano curve, or another suitable type of progressively finer scanning curve. These scans can achieve progressively finer detail over time, such as by incrementally increasing the order of the curve, allowing users to decide whether to continue scan based on coarser, earlier data. FIG. 12A illustrates an example of how a space-filling curve fills in the area to be scanned over time.

Figure 12B:
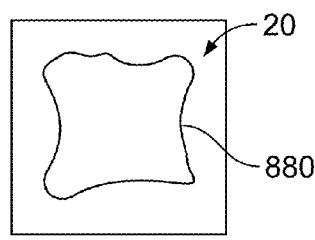

In another embodiment, controller 600 is adapted to control the beam scanners to scan the beam probe in a specific region-of-interest (ROI). These can scan around within a particular region. The region may be rectangular in shape in one example, but can alternatively have a non-rectangular shape. FIG. 12B illustrates an example of a non-rectangular-shaped ROI 880 of sample 20 that is to be scanned over time.

Figure 12C:
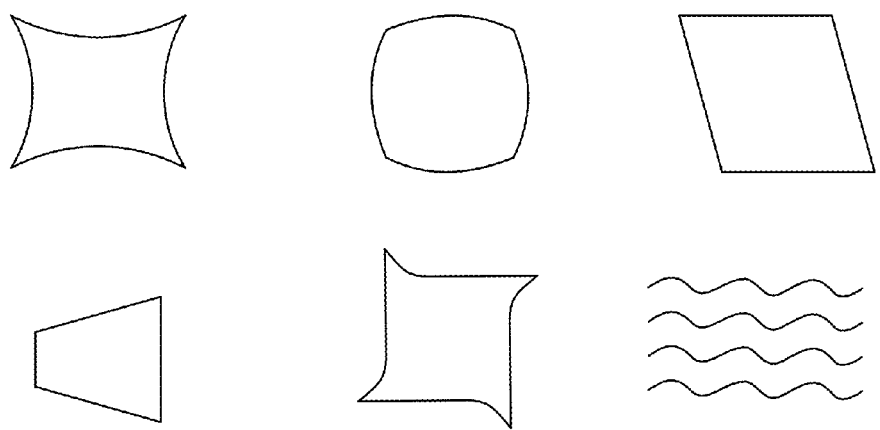

In yet another embodiment, controller 600 can control the beam scanners to scan the beam probe to compensate for distortions (e.g., instabilities). Such distortions could be space-related distortions (such as, for example, pin-barrel distortion, where pixels are distorted based on distance from center) or time-based (for example, mains-frequency distortions, which may happen periodically over time). FIG. 12C illustrates examples of scan areas containing scan paths that are designed to compensate for distortions.

Figure 13A:
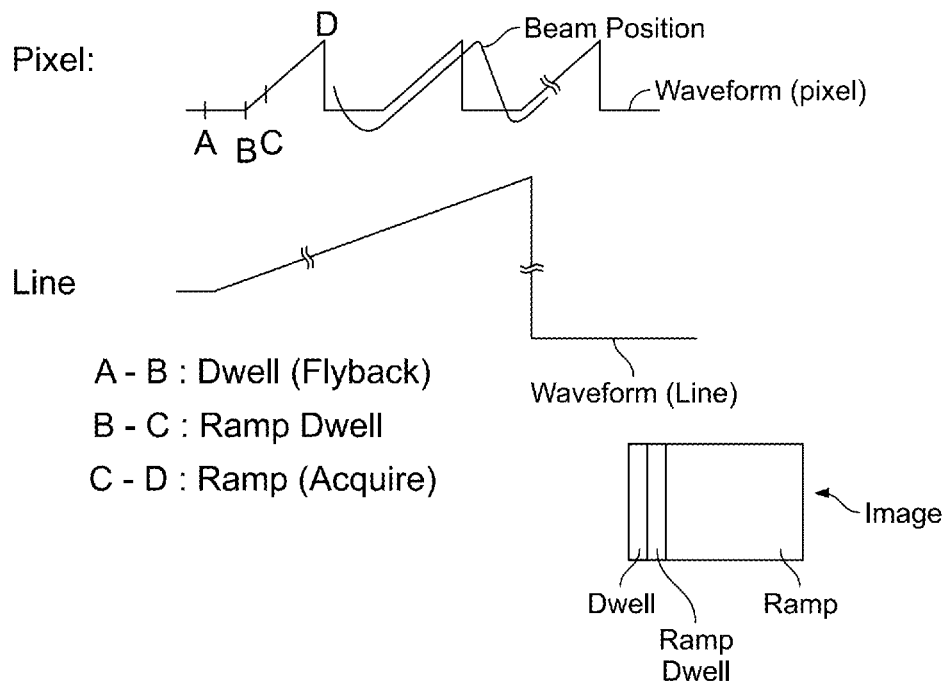
FIGS. 13A and 13B are plots of different exemplary embodiments of ramp signals provided to beam scan generators, illustrating how the ramp signal can be modulated to cancel a periodic distortion.
Figure 13B:
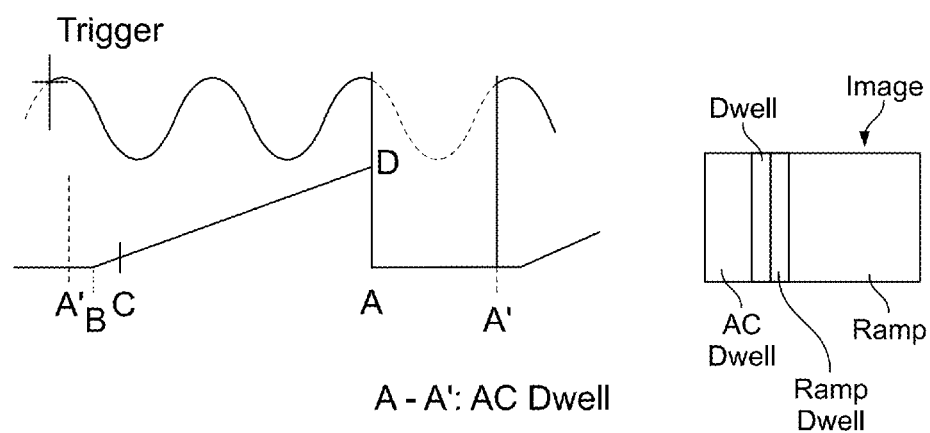

FIGS. 13A,B illustrate another embodiment of compensating for a distortion that is periodic in time, by synchronizing a ramp signal used to scan the beam to the periodicity of the source of distortion. The source of periodic distortion may be, for example, AC mains-frequency. FIG. 13A shows scanning that is not synchronized to a periodic distortion. In this example, the beam movement is delayed behind the ramp signal. The signal contributes to the image is acquired during the ramp-up of the ramp signal, after an initial "ramp dwell" that compensates for the delay of the beam movement. FIG. 13B, meanwhile, shows how the ramp signal can be triggered at a predetermined point of the periodic distortion. Before the predetermined point is reached for the next cycle, the ramp signal can be held at zero, which is referred to in this example as an "AC dwell" position.

In still another embodiment, the controller is adapted to control the beam scanners to scan the beam probe in a direction opposing the motion of the sample, such as due to stage movement. When the sample is being moved, it may be helpful to scan with the fast direction perpendicular to the motion, and the "y" direction opposite to the direction of motion. This means any images acquired can see the sample compressed in the direction of motion, but areas will not be skipped (which they would if, e.g., the "y" direction was in the direction of motion).

In one version, microscope 10 may generate at least two types of images of sample 20. The first category is survey images, which may be taken to generate a high-framerate survey video. These survey images may be used for tuning the microscope, and finding the appropriate area of the sample on which to conduct more detailed imaging. The second category is high-resolution images. When imaging in the high-resolution mode, the microscope may be slower and less responsive than in the survey mode, but can provide more detail and less noise than the survey images, or signals that may be unavailable at high framerates (e.g., x-ray composition data).

In one embodiment, microscope 10 performs a preliminary, lower-resolution imaging of sample 20 before the principal, higher-resolution imaging of sample 20. The preliminary imaging may be, for example, a faster or lower-dose scan of sample 20 used to determine the locations of one or more features of interest in sample 20. These features may include, for example, a specific cell body with a tag that sets it apart from other cell bodies, or each of multiple polymer strands. This scan may, in one embodiment, cover a substantially contiguous area, rather than being limited to particular and discrete scanning areas. Surveying may also be performed outside of microscope 10, where fiducials on sample 20 or another registration mechanism is provided, such as using a different type of charged-particle microscope or alternatively an optical microscope (such as for fluorescent or light-visible tags).

The controller may then define the scanning areas such that the scanning areas track sample 20 based on the determined location of sample 20. By defining scanning areas that track sample 20, microscope 10 may be able to avoid even more empty area where areas of interest of the sample are not present, eliminating wasteful acquisition of pixels and providing effectively faster imaging speeds. Using the scanning areas, the controller may perform a slower or higher-resolution scan within the scanning areas, thus concentrating the imaging on the actual location of sample 20 and thereby improving efficiency. For example, within each scanning area microscope 10 may raster scan the charged-particle beam.

It is typically desirable to have the image that is produced by the imaging system accurately represent information in the sample needed for analysis. In the ideal case of perfect imaging, the image faithfully reproduces the features of the sample that are needed for analysis. In the real world, however, imaging is often imperfect. In some cases, distortions due to imperfect imaging conditions can result in a warped image. These distortions may be caused, for example, by instabilities in the environment such as stray electric or magnetic fields, mechanical vibrations, temperature fluctuations, or internal instabilities such as power supply ripple, ground noise, or periodic electrical discharges.

The controller may be adapted to automatically diagnose the magnitudes of various aberrations and apply compensating signals to the optical system, such as to one or more of the optical elements that may cause aberrations and/or the aberration corrector (e.g., aberration corrector 90). Microscope 10 may be especially adapted to correct for two types of image distortions: (1) distortions that are periodic in time, and (2) distortions that are static in time. An example of the first type involves displacement of the beam-probe location due to mains AC fields.

One exemplary method is to raster scan one or more tuning regions of sample 20 to generate an image and to analyze the generated image to extract information about aberrations that can be used to correct the aberrations. The tuning regions may be of any shape or size and may be located within or outside of the areas to be scanned.

Distortions can be diagnosed by analyzing images of the same sample taken using different scan parameters. Based on the types of distortions to correct, more images may be generated that have different rotations, sampling frequency, sampling spacing, magnification, etc. Periodic and static distortions can be extracted from some or all of the above comparisons, based on assumptions about the distortions.

Figure 14A:
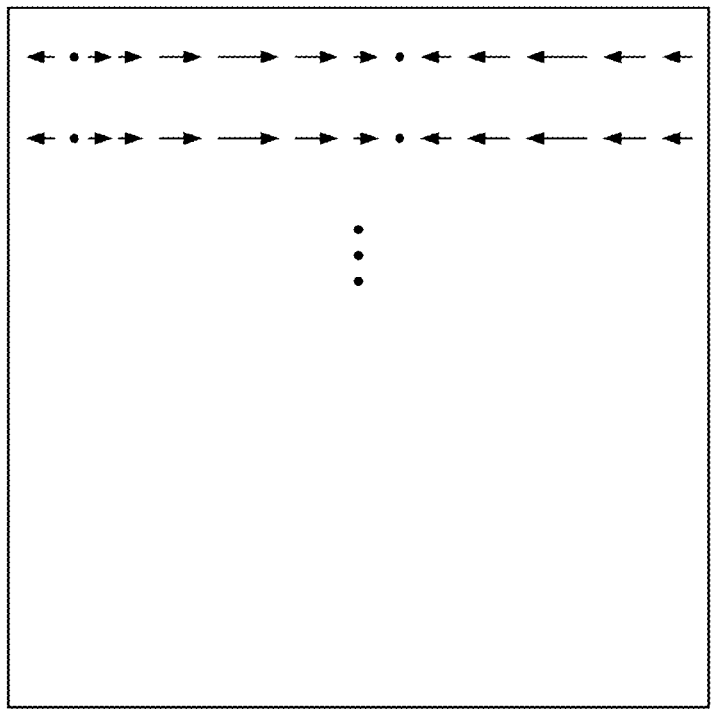
FIGS. 14A and 14B are schematic diagrams of an example of an embodiment of scanning a charged-particle beam across a sample in two orthogonal directions in order to obtain information about image distortions.
Figure 14B:
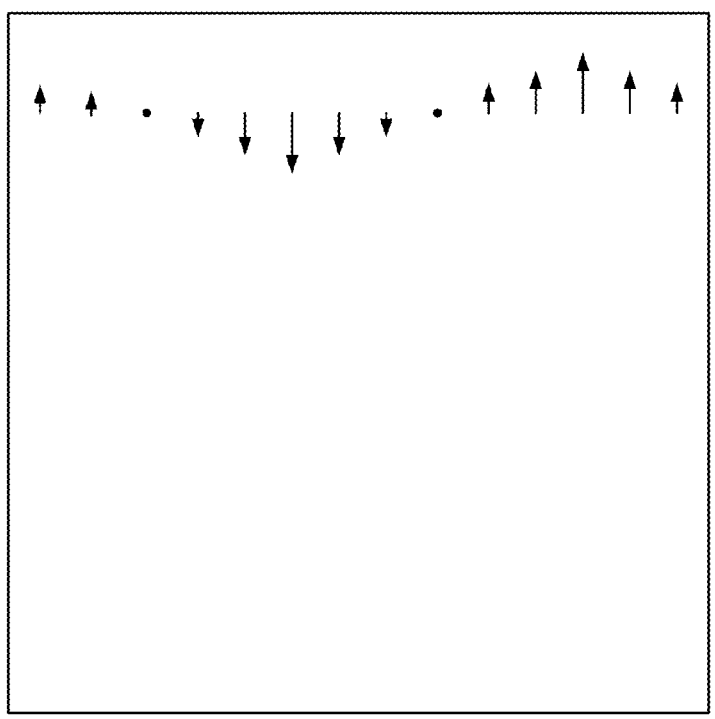

For example, in a conventionally rastered image, wherein the fast "x" direction represents the pixel scan that increments each pixel clock, and the slower "y" direction represents the line scan that increments only after a full pixel width of the field of view is acquired, an image can be recorded with the fast, "x" direction, then another image of the same sample can be acquired in a direction that is rotated by approximately 90 degrees in relation to the previous "x" direction. By comparing the location of features between the two images of the same sample, a map of distortion can be calculated across either image. FIGS. 14A,B, respectively, illustrate examples of distortions visualized along two orthogonal directions.

Another exemplary method is to acquire one or more images as a function of illumination tilt and defocus, and to extract the blurring effect of the tilt and defocus. The blurring gives a value for the defocus and astigmatism at a variety of angles. This process can provide sufficient data to numerically compute an aberration function for the imaging system. Yet another method is to defocus the charged-particle beam and use a bright-field detector (e.g., bright-field detector 190C), such as a CCD camera, to generate a Ronchigram image, or a plurality of Ronchigram images taken at different positions of sample 20, and then refocus the charged-particle beam for continued imaging of the sample. The Ronchigram image can provide sufficient aberration information to derive optical parameters that permit suitable compensation for these aberrations.

Once distortions are measured the data could be presented to the user as a measure to help diagnose instabilities. It could also be used as input to a post processing algorithm to remove distortions. This algorithm could be applied to future images assuming the distortions remain constant. It could also be used and fed back in to the scanning unit to correct for the distortions by changing the scanning locations (e.g., moving the beam to a location where adding the measured distortion will place the beam at the required location). Following the application of any of these or other correcting techniques, the process could be applied again iteratively, each time measuring and potentially correcting finer distortions.

A sample used for the purposes of diagnosing aberrations may contain, for example, single atoms or clusters of atoms, or may be another kind of sample adapted to permit microscope 10 to diagnose optical aberrations. For example, the sample may be the same sample 20 that is also the subject of interest for study. Alternatively, the sample may be a reference sample used solely for calibration of microscope 10. Distortions relative to the known structure of the reference sample can then be extracted.

Figure 15:
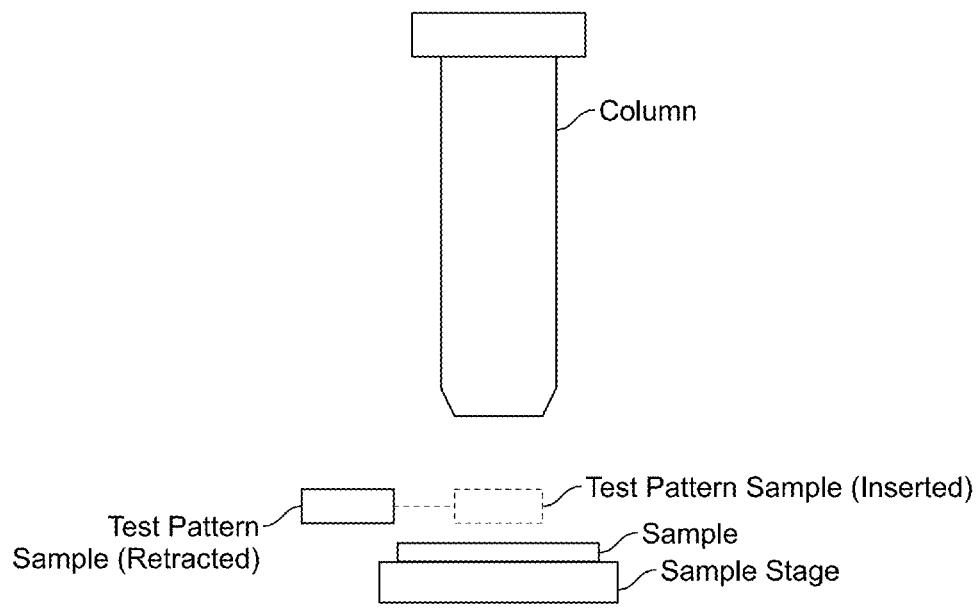
FIG. 15 is a schematic side view of an example of an embodiment of a charged-particle beam microscope having a mechanism for inserting and retracting a reference sample from the beam path of the microscope column.

In one version, microscope 10 even contains a mechanism for inserting the reference sample into the beam path for calibration, and retracting the reference sample when it is not being imaged. In this version, the reference sample may even be kept inside microscope 10 such that the mechanism can readily insert the reference sample into the beam path for calibration of microscope 10. FIG. 15 illustrates an example of such a mechanism.

As an alternative to taking multiple images according to different imaging parameters as described above to measure the distortion in situ, distortions may be modeled based on a priori information. For example, one can assume that distortions are approximately sinusoidal in time, since mains-induced AC fields are similarly sinusoidal in time. In either case, an "undistort" transform can be calculated that is dependent on parameters of the detected or chosen distortion model. This transform may be used to derive a correction applied to a distorted image in order to achieve a substantially undistorted image. These parameters could be varied until the corrected (undistorted) image met some certain criteria (e.g., roundness of features, lack of streakiness in the image).

Figure 16:
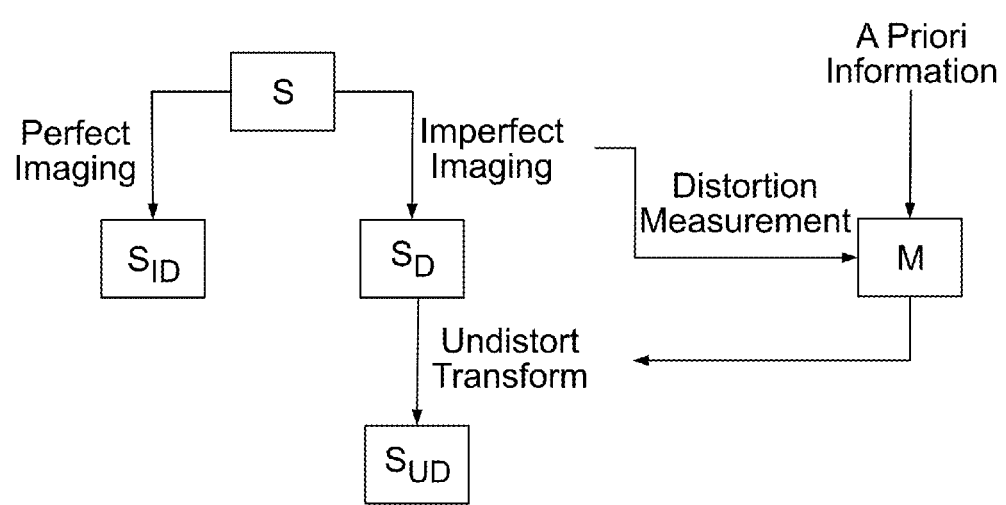
FIG. 16 is a flowchart of an example of an embodiment of a method for correcting distortions.

An example of an embodiment of a distortion-correction process is illustrated in FIG. 16.

The elements on which operations are performed in this example are abbreviated as:

S: sample
$S_{ID}$: idealized sample image
$S_D$: distorted sample image
$S_{UD}$: undistorted sample image
M: distortion model derived from measurements and/or a priori information The aim in this example is for the undistorted sample image ($S_{UD}$) to approximate the idealized sample image ($S_D$). In other words, in this embodiment it is desired to generate an undistorted image that approximates an image taken under perfect imaging conditions. The undistort transform may be derived from a model created based on a distortion.

For example, if imperfect imaging causes the image to become distorted with a distortion function d(x), then the pixel at location x in reality came from x+d(x) and we need to find the w(x)—the undistort transform—that optimally undistorts the image. In an undistorted image, w(x)=0 will be zero; the pixel at location x is taken from x'=x. To create an undistort transform, consider a distorted image, in which the pixel at location x should come from position x'=x+w(x) taken from the distorted image. w(x) may be a fractional position, in which case interpolation methods can be used to estimate the value at that location.

Figure 17A:
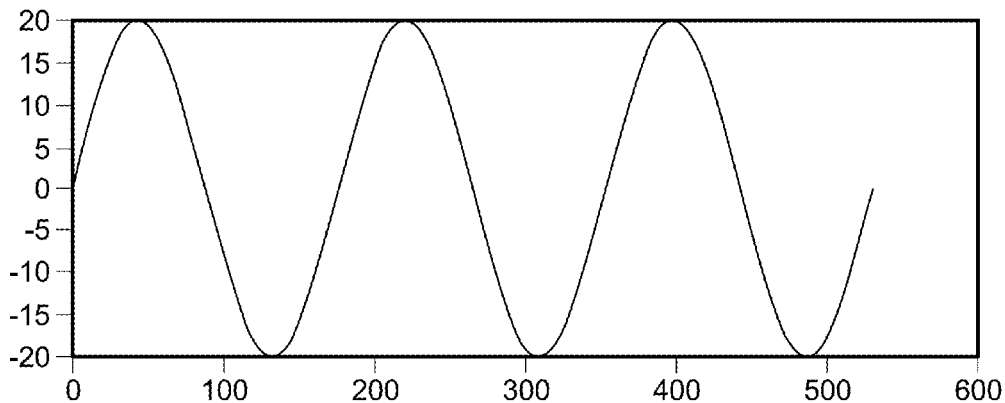

In this example, a test image is distorted with a purely sinusoidal distortion function produce a distorted starting image that will be substantially corrected using the distortion model. In practice, this distortion function could be any function, such as periodic or static. FIG. 17A shows the original sample image (S), the distortion function, and the resulting distorted sample image ($S_D$).

Figure 17B:
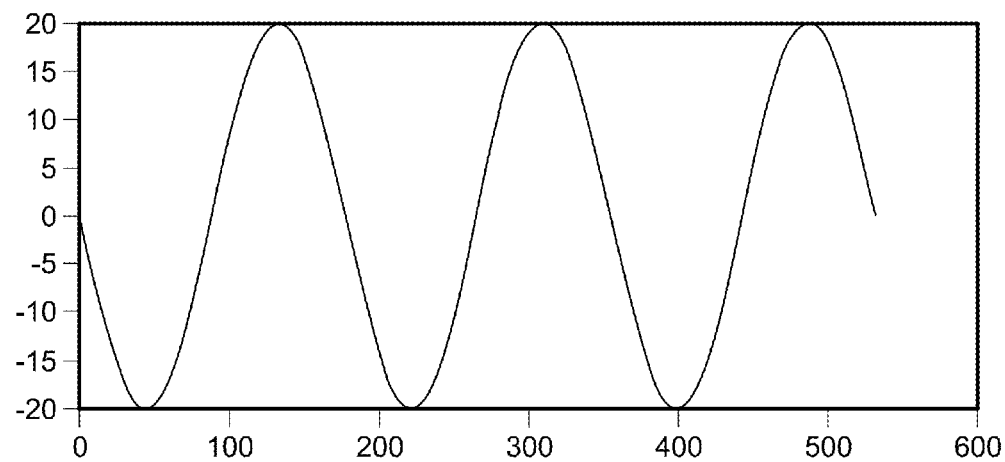

As a first approximation, we may consider w(x)=−d(x) as a potential solution. This approximation is referred to herein as the "simple" solution. This approximation unwarps the image based on the formula x'=x+d(x)−d(x+d(x)). While this is a good first approximation, it is not generally perfect. It does, however, provide a fast and simple method for unwarping images that is typically accurate for small distortions. FIG. 17B shows this simple solution, and the result from using this simple solution to "undistort" the warped image is shown at the bottom of the figure.

The example illustrated above has large enough distortions that, in this case, the simple method, although improving the image somewhat, fails to return us to a sufficiently undistorted image. Thus, a closer approximation to the desired undistort mapping can be calculated, for a given distortion model. This closer approximation is referred to herein as the "advanced" solution. This "advanced" approximation may involve determining w' such that x=x+d(x)+w'(x+d(x)), or w'(x+d(x))=−d(x). This could be done analytically or numerically, and may be more time-consuming than the "simple" method, but will produce more accurate undistorted results (i.e., $S_{UD}$ closer to $S_{ID}$). The result of numerically finding the undistort function for the example distortion is shown in FIG. 17C, along with the text undistorted using the advanced undistort transform.

Examples of the effects of "simple" and "advanced" undistort functions are shown together in FIG. 17D, showing the differences between these solutions for this example. The green line is "simple" and the red line "advanced." Comparing the undistorted images produced by the two methods side-by-side shows the improvement the advanced method gives in this case (in FIG. 17E, top: simple, middle: advanced, bottom: original).

Figure 18A:
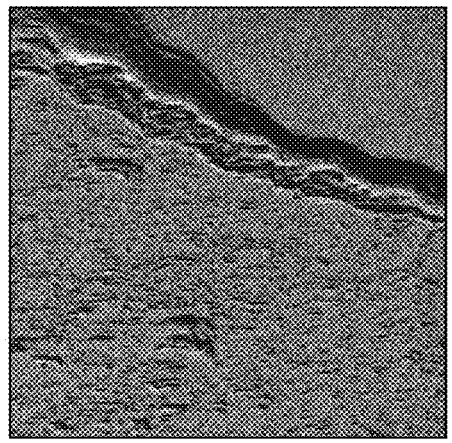
FIGS. 18A, 18B, and 18C are grayscale bitmaps of an image that contains a distortion and has not undergone any distortion correction processing, an image that has undergone a "simple" embodiment of distortion correction processing, and an image that has undergone an "advanced" embodiment of distortion correction processing, respectively.
Figure 18B:
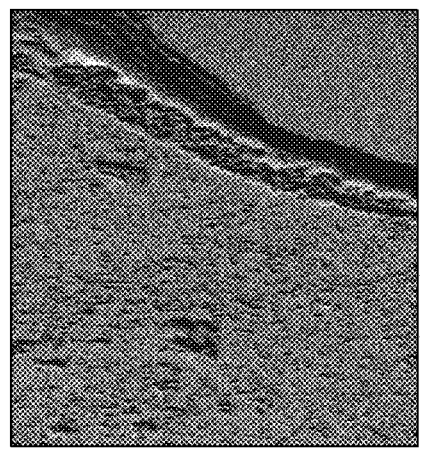
Figure 18C:
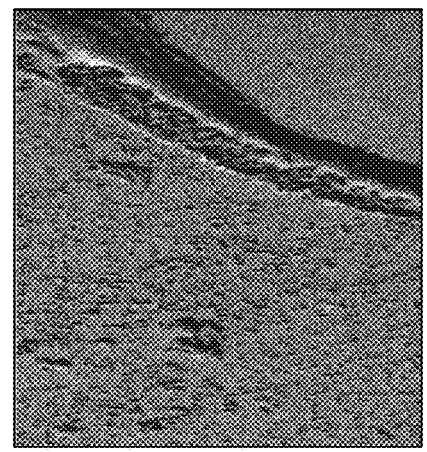

Furthermore, there may be additional methods to unwarp the images without assuming a simple one-to-one unwarp function. For example, the image data may be processed directly without modelling an intermediate function, such as by simply pixel data directly to a table and then interpolating between the points to extract an unwarped approximation. This can allow for correction of distortions that may not be representable as functions, if, for example, the distortion leads to the same point in the image appearing twice. As an example using real data, we assume as above, that a distorted image has purely sinusoidal distortions at the mains frequency. The phase and strength of these distortions can be varied until the image appears as undistorted as possible (e.g., horizontal streaks are removed, and certain lines appear straighter). Varying the phase and strength in this method may be done automatically by the controller, or manually by a human operator. FIGS. 18A-C show three images: (1) un-processed, (2) processed using the simple method, and (3) advanced solution that is calculated numerically.

Images collected using a scanning system can be susceptible to regular distortions, normally time-dependent (at a regular frequency). It is also possible they could be space dependent if the scanning system introduces systematic distortions. The net result of such distortions is to cause errors in the image to occur at specific pixel frequencies.

In one embodiment, these errors can be removed from the image by the following steps. First, an image is provided that contains distortions (which may also be referred to as "instabilities"). FIG. 19A shows an example of an instability signal. For certain distortions, such as periodic distortions, for example, the distortions may appear as "squiggles" in the image. FIG. 19B shows an example of an image having "squiggles" that indicate the presence of instability from FIG. 19A. Next, a Fourier transform may be applied to the image to observe the image in frequency space. FIG. 19C shows an example of the Fourier-transformed image of FIG. 19B. In the Fourier-transformed image, ranges of frequencies that include frequencies causing the distortions may be removed from the Fourier-transformed image (which may be referred to as "filtering"). The exact method of removal may include, for example, using a window function (e.g., Hamming, Hann, Gaussian, or Butterworth) and picking a shape so that distortions are removed with the least amount of detrimental damage to the original image. FIG. 19D shows an example of removing (or "masking") information from regions in frequency space corresponding to the instability. After the image has been filtered in frequency space, the inverse Fourier transform may be applied to the image. When the resulting image is viewed, distortions may be substantially filtered out (e.g., no more visible "squiggles"). FIG. 19E shows the image of FIG. 19B with the instability and corresponding "squiggles" removed. These steps may be performed manually, or they may be performed automatically by controller 600.

The controller may evaluate information originating at one or more of the detectors, either between imaging cycles or simultaneous with imaging, to determine the current quality of imaging. In one version, imaging information from dedicated "tuning regions" is used. However, the images themselves may additionally or alternatively be used. For example, information from the most recent images can be used to determine trends of tuning deterioration. This evaluation can be used to set parameters of microscope 10 to improve the quality of imaging. For example, returning to FIG. 1, the parameters may be applied to condenser lenses (e.g., condenser lenses 70A-C), the objective lens (e.g., objective lens 100), the aberration corrector (e.g., aberration corrector 90), and the stage (e.g., stage 15). In an illustrative example, the parameters applied to the condenser lenses, the objective lens, and the stage may improve the focus, while the parameters applied to the aberration corrector may compensate for higher orders of aberration. This process may be referred to as "re-tuning" the microscope.

It may be desirable to maintain the microscope in a substantially steady state in terms of contamination and stability during imaging. But the performance of the optical system may tend to deteriorate over time. In one example, the optical system may deteriorate to an undesirable state in from about 5 to about 30 minutes, such as about 15 minutes. When this happens, it may become advantageous to perform re-tuning. In one version, first-order and second-order aberrations may be especially prone to deterioration and/or advantageous to compensate for by re-tuning. The electron beam source may also deteriorate over time. To refresh the electron beam source, it can be "flashed" by running a high current through it between beam scanning cycles. This causes a localized heating of the filament that reconditions the source.

Re-tuning may be triggered according to any suitable procedure. The controller may monitor the microscope to initiate the determination of imaging quality, the controller may automatically initiate re-tuning at regular intervals, or the controller may poll a store of recently generated images to determine image quality as a background process. For example, the re-tuning may be triggered within any desired time interval, such as within any quantity of hours or minutes, or subsequent to any quantity of images generated by the microscope or every Nth linear scan or scan cycle performed by the microscope. In an exemplary embodiment, the controller initiates re-tuning between sequential fields of view. In another embodiment, however, the controller can re-tune the optical system between sequential scanning areas.

At each of the sub-areas, microscope 10 may image a tuning region within or without the sub-area one or more times to generate one or more sub-images that can be used to track the sample and/or produce imaging metadata. The imaging metadata may include, for example, focus error and amounts of various orders of aberration, and beam current. The controller may use the imaging metadata to modify parameters to improve image quality, such as, for example, to autofocus the image at the elevation of sub-area. For example, the controller may evaluate several sub-images taken in a particular area to determine the magnitude and direction of focus error. Using this information, microscope 10 can generate a final well-focused sub-image that will be used for evaluation of the sample itself. microscope 10 may use any number of sub-images of a sample to determine imaging metadata. The sub-images may cover any desired variation range for a particular parameter.

In analyzing an image, the controller may analyze any suitable characteristics of the image, such as intensity, pixel counts, or power, each of which may be analyzed in real space or in frequency space (so that intensity may be within or without a spatial frequency range). When comparing images or evaluating a series of images, the controller utilizes any characteristic that differs between the images, such as in a preselected region of the images.

The controller may also use any number of images for the image quality comparison, where the image quality values for current and prior images may be combined in any suitable fashion, such as averaged, weighted, or summed. A user threshold for image quality may be set to any suitable value. A comparison of image quality values may utilize any mathematical or statistical operations to determine image quality compliance, such as a comparison, statistical variance, or deviation.

The imaging process may be performed automatically, such as after initiation by a user or initiation by a larger process of which the imaging is a subprocess. Parameters may be determined automatically and applied to the microscope. Alternatively, any part of the technique, such as scanning of images, determination of parameters, or application of the parameters, may be performed manually. For example, a computer system may provide the optimal settings to a technician who manually applies the settings to the microscope. The microscope controller may perform any desired processing, such as monitoring and adjustment of optical parameters or image formation and processing. For example, the controller may align images using image registration algorithms. The controller may also adjust the aberrations and defocus of an image based on characteristics of a previous image.

Microscope 10 may be used in any suitable facility in any desired arrangement, such as networked, direct, or indirect communication arrangements. Moreover, the various functions of microscope 10 may be distributed in any manner among any quantity of components, such as one or more hardware and/or software modules or units. The hardware may include microscopes, machine managers, computer or processing systems, circuitry, networks, and image stores, that may be disposed locally or remotely of each other and may communicate with each other or be coupled to each other in any suitable manner, such as wired or wireless, over a network such as WAN, LAN, Intranet, Internet, hardwire, or modem, directly or indirectly, locally or remotely from each other, via any communications medium, and utilizing any suitable communication protocol or standard. The software and/or algorithms described above may be modified in any manner that accomplishes the functions described herein.

Microscope 10 described herein may be implemented with either electrostatic or magnetic components, or a combination thereof. The microscope may include any quantity of electrostatic or magnetic components, such as an electron or other charged-particle gun, lenses, a dispersion device, stigmator coils, electron detectors, and stages, arranged within or outside of the microscope in any suitable fashion. Image stores, files, and folders used by the microscope system may be of any quantity and may be implemented by any storage devices, such as memory, database, or data structures.

Implementation of aspects of the microscope, such as the image processing or aberration correction, may be distributed among the controller or other processing devices in any desired manner, where these devices may be local or remote in relation to one another. The controller may communicate with and/or control the microscope to perform any desired functions, such as scanning the specimen and generating the images or transferring images to memory.

Figure 20A:
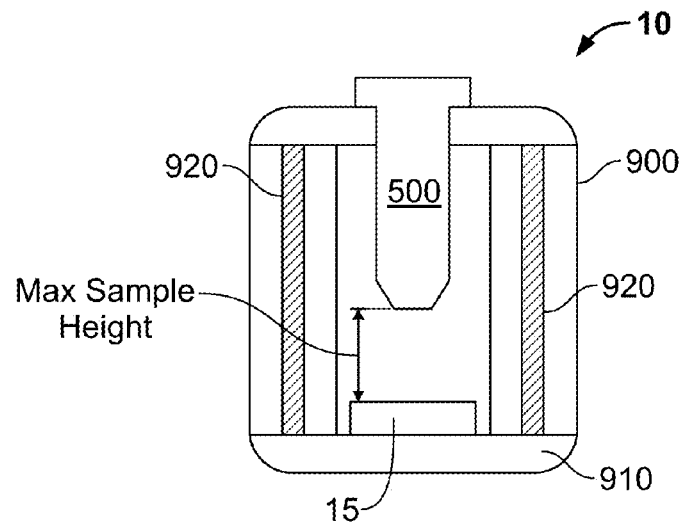
FIGS. 20A and 20B are schematic side views of an example of an embodiment of a charged-particle beam microscope having a housing that can be raised from a baseplate in order to be able to exchange a sample within.
Figure 20B:
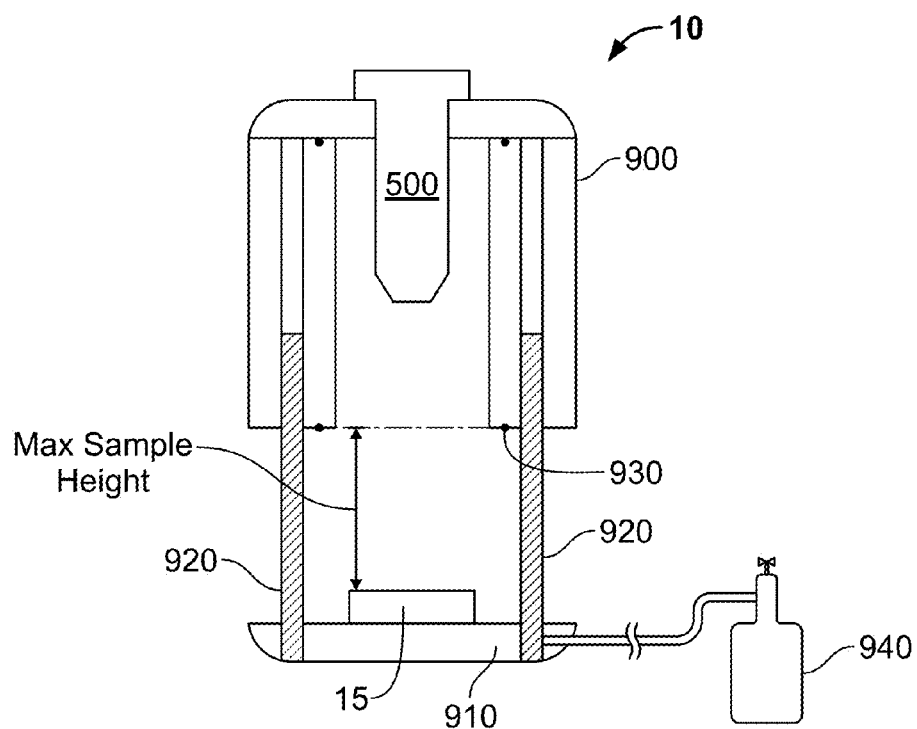
Figure 20C:
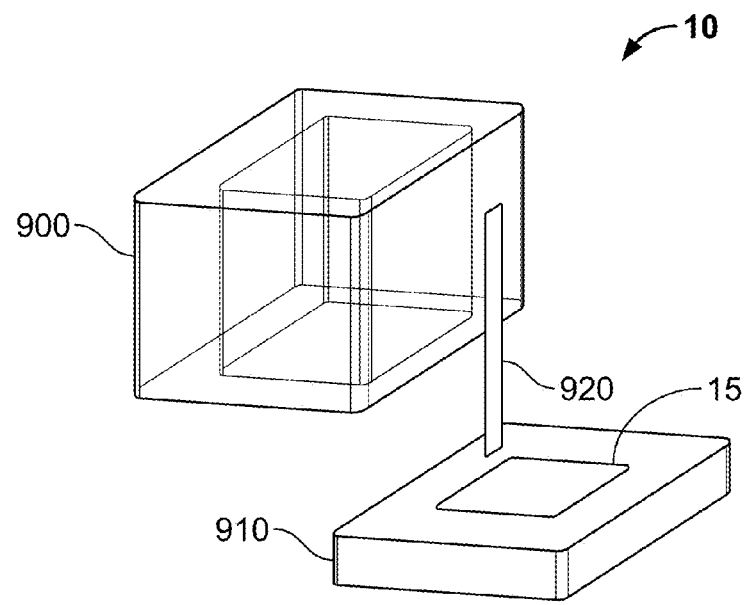
FIG. 20C is a perspective view of an example of another embodiment of a charged-particle beam microscope having a housing that can be raised from a baseplate in order to be able to exchange a sample within.

The modular microscope column may be mounted inside a slidable housing that contains the sample volume. FIGS. 20A-C illustrate an example of an embodiment of microscope 10 having a slidable housing 900.

A baseplate 910, which supports stage 15, may have hollow guide rails 920 on which the housing 900 is aligned, such that housing 900 can slide up and down along rails 920. When housing 900 is lowered onto baseplate 910, a seal 930 is formed, allowing the inner chamber volume to be isolated from the external environment. A source of pneumatic pressure 940, such as, for example, a pneumatic cylinder, may be connected to guide rails 920, to force air up through rails 920, controlling the height of housing 900 so that the sample on stage 15 can be exchanged.

Pneumatic pressure source 940 may use pressurized inert gas to simultaneously vent column 500 and raise housing 900. This may have the added advantage of making it less likely that water vapor or other impurities from the external environment will adsorb onto surfaces inside housing 900, allowing for faster pump-down and protecting the components inside housing 900 from foreign contaminants.

In another embodiment, only a single full-height rail 920 is used (the second may be half-height or omitted entirely). Housing 900 lifts on the full-height rail 920 and can be rotated and locked.

Figure 21:
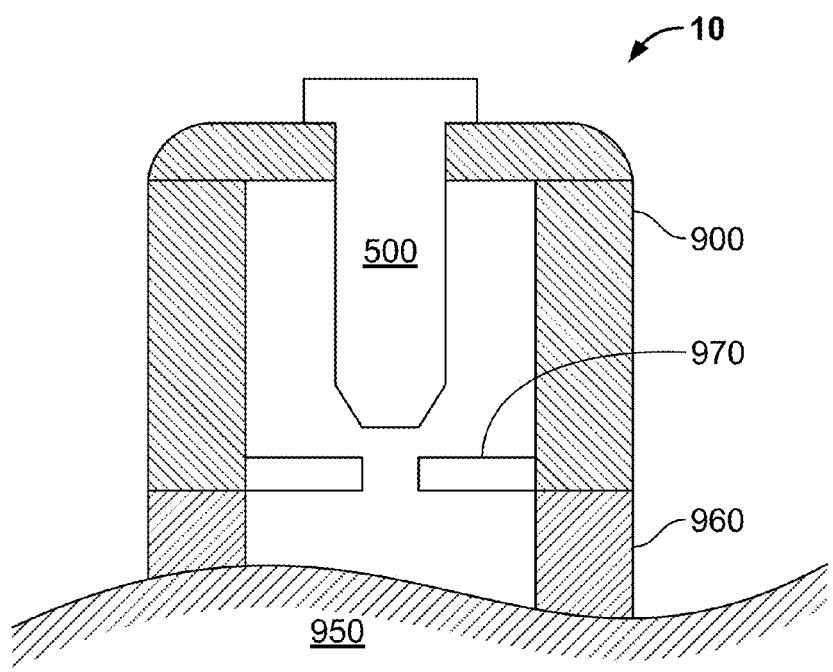
FIG. 21 is a schematic side view of an example of an embodiment of a charged-particle beam microscope having a conformal seal that can be portable and that can be pressed onto a sample for imaging of the sample.

In yet another embodiment, illustrated in FIG. 21, housing 900 may be mated to a surface 950 by means of a conformal seal 960, which conforms to the shape of surface 950 to be analyzed, and forming an isolated environment suitable for imaging. Such a seal could be made of a conductive material. The seal could be made of metal, such as seal that is a copper gasket or a metal c-ring. In certain other examples, the seal is a flexible o-ring, such as made of Viton®, silicone, or another suitable material. This embodiment may also have a collision guard 970 to prevent internal damage of the microscope by collision with outside objects. This mating embodiment of housing 900 could be used, for example, to investigate crack dimensions on airplane wings.

Although the foregoing embodiments have been described in detail by way of illustration and example for purposes of clarity of understanding, it will be readily apparent to those of ordinary skill in the art in light of the description herein that certain changes and modifications may be made thereto without departing from the spirit or scope of the appended claims. It is also to be understood that the terminology used herein is for the purpose of describing particular aspects only, and is not intended to be limiting, since the scope of the present invention will be limited only by the appended claims.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only," and the like in connection with the recitation of claim elements, or use of a "negative" limitation. As will be apparent to those of ordinary skill in the art upon reading this disclosure, each of the individual aspects described and illustrated herein has discrete components and features which may be readily separated from or combined with the features of any of the other several aspects without departing from the scope or spirit of the disclosure. Any recited method can be carried out in the order of events recited or in any other order which is logically possible. Accordingly, the preceding merely provides illustrative examples. It will be appreciated that those of ordinary skill in the art will be able to devise various arrangements which, although not explicitly described or shown herein, embody the principles of the disclosure and are included within its spirit and scope.

Furthermore, all examples and conditional language recited herein are principally intended to aid the reader in understanding the principles of the invention and the concepts contributed by the inventors to furthering the art, and are to be construed without limitation to such specifically recited examples and conditions. Moreover, all statements herein reciting principles and aspects of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary configurations shown and described herein. Rather, the scope and spirit of present invention is embodied by the claims.

In this specification, various preferred embodiments have been described with reference to the accompanying drawings. It will be apparent, however, that various other modifications and changes may be made thereto and additional embodiments may be implemented without departing from the broader scope of the claims that follow. The specification and drawings are accordingly to be regarded in an illustrative rather than restrictive sense.

We claim:

1. A charged-particle beam microscope for imaging a sample, the microscope comprising:
    a stage to hold the sample;
    a housing to enclose a first volume at a first predefined vacuum pressure, the housing comprising an electrical contact;
    a charged-particle beam module to be inserted into the housing and also to be removed from the housing, the charged-particle beam module comprising:
        a chamber comprising one or more walls to enclose a second volume at a second predefined vacuum pressure, the second predefined vacuum pressure being different from the first predefined vacuum pressure, the walls of the chamber being adapted to separate the second volume from the first volume and to maintain a pressure differential between the first and second volumes;
        a charged-particle beam source inside the second volume to generate a charged-particle beam;
        one or more beam optical components inside the second volume to converge the charged-particle beam onto the sample; and
        one or more feedthroughs to allow one or more electrical signals to be conducted from outside the charged-particle beam module into the second volume, at least one of the feedthroughs comprising an electrical contact that is exposed outside the charged-particle beam module, the exposed electrical contact of the charged-particle beam module being adapted to couple to the electrical contact of the housing when the charged-particle beam module is fully inserted into the housing;
    a detector to detect radiation emanating from the sample to generate an image; and
    a controller to analyze the detected radiation to generate an image of the sample.

2. The charged-particle beam microscope of claim 1, comprising a volume separator to substantially isolate the second volume from the first volume, the volume separator comprising an aperture that substantially limits gas flow between the volumes.

3. The charged-particle beam microscope of claim 1, wherein the walls of the chamber are adapted to separate a pressure differential ratio between the second volume and the first volume of from about $1 \times 10^2$ to about $1 \times 10^{10}$.

4. The charged-particle beam microscope of claim 1, wherein at least one beam-optical component is disposed inside the first volume.

5. The charged-particle beam microscope of claim 1, further comprising an evaporator inside the housing to evaporate a contrast-enhancing material onto the surface of the sample.

6. The charged-particle beam microscope of claim 1, further comprising a reference sample and a mechanism that is adapted to insert the reference sample into the path of the charged-particle beam such that the reference sample can be imaged to calibrate of the microscope.

7. The charged-particle beam microscope of claim 1, comprising a volume separator to substantially isolate the second volume from the first volume, the volume separator comprising a membrane that is adapted to be substantially transparent to the charged-particle beam while being substantially impermeable to gas.

8. The charged-particle beam microscope of claim 7, wherein the membrane comprises silicon nitride (SiN).

9. The charged-particle beam microscope of claim 7, wherein the membrane is adapted to be energized with an electric potential to place a charge on axis of the beam.

10. The charged-particle beam microscope of claim 1, wherein the charged-particle beam module is adapted to form a vacuum seal between the first volume and an external environment when the charged-particle beam module is inserted and locked into the housing.

11. A charged-particle beam microscope for imaging a sample, the microscope comprising:
   a housing to enclose a first volume at a first predefined vacuum pressure, the housing comprising an electrical contact;
   a stage to hold the sample in the first volume;
   a charged-particle beam module to be inserted into the housing and also to be removed from the housing, the charged-particle beam module comprising:
      a chamber comprising one or more walls to enclose a second volume at a second predefined vacuum pressure, the second predefined vacuum pressure being different from the first predefined vacuum pressure;
      a charged-particle beam source inside the second volume to generate a charged-particle beam;
      one or more beam optical components inside the second volume to converge the charged-particle beam onto the sample;
      a volume separator to separate the second volume from the first volume and to maintain a pressure differential between the first and second volumes; and
      one or more feedthroughs to allow one or more electrical signals to be conducted from outside the charged-particle beam module into the second volume, at least one of the feedthroughs comprising an electrical contact that is exposed outside the charged-particle beam module, the exposed electrical contact of the charged-particle beam module being adapted to couple to the electrical contact of the housing when the charged-particle beam module is fully inserted into the housing;
   a detector to detect radiation emanating from the sample to generate an image; and
   a controller to analyze the detected radiation to generate an image of the sample.

12. The charged-particle beam microscope of claim 11, wherein the volume separator comprises an aperture that substantially limits gas flow between the first and second volumes.

13. The charged-particle beam microscope of claim 11, wherein the volume separator comprises a membrane that is adapted to be substantially transparent to the charged-particle beam while being substantially impermeable to gas.

14. The charged-particle beam microscope of claim 13, wherein the membrane comprises silicon nitride (SiN).

15. The charged-particle beam microscope of claim 13, wherein the membrane is adapted to be energized with an electric potential to place a charge on axis of the beam.

16. The charged-particle beam microscope of claim 11, wherein at least one beam-optical component is disposed inside the first volume.

17. The charged-particle beam microscope of claim 11, wherein the volume separator maintains a pressure differential ratio between the second volume and the first volume of from about $1 \times 10^2$ to about $1 \times 10^{10}$.

18. The charged-particle beam microscope of claim 11, wherein the charged-particle beam module is adapted to form a vacuum seal between the first volume and an external environment when the charged-particle beam module is inserted and locked into the housing.

* * * * *